(12) United States Patent
Oura

(10) Patent No.: US 6,701,461 B2
(45) Date of Patent: Mar. 2, 2004

(54) METHOD AND APPARATUS FOR TESTING A CACHE

(75) Inventor: Hironobu Oura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 625 days.

(21) Appl. No.: 09/737,487

(22) Filed: Dec. 18, 2000

(65) Prior Publication Data

US 2001/0001157 A1 May 10, 2001

Related U.S. Application Data

(63) Continuation of application No. PCT/JP99/00364, filed on Jan. 28, 1999.

(30) Foreign Application Priority Data

Jul. 1, 1998 (JP) .......................... 10-186605

(51) Int. Cl.⁷ .............................................. G06F 11/00
(52) U.S. Cl. ...................... 714/42; 711/118; 714/718
(58) Field of Search ........................ 714/42, 5, 763, 714/718; 711/118, 144, 145, 133

(56) References Cited

U.S. PATENT DOCUMENTS

| | | | | | |
|---|---|---|---|---|---|
| 4,575,792 | A | * | 3/1986 | Keeley | 714/42 |
| 5,592,616 | A | * | 1/1997 | Finch et al. | 714/42 |
| 5,617,534 | A | * | 4/1997 | Balmer et al. | 714/42 |
| 5,958,072 | A | * | 9/1999 | Jacobs et al. | 714/30 |
| 6,170,070 | B1 | * | 1/2001 | Ju et al. | 714/718 |
| 6,240,532 | B1 | * | 5/2001 | Cho | 714/42 |
| 6,591,332 | B1 | * | 7/2003 | Swanson et al. | 711/108 |
| 2002/0007440 | A1 | * | 1/2002 | Hosoya et al. | 711/122 |
| 2003/0051197 | A1 | * | 3/2003 | Evans | 714/718 |

FOREIGN PATENT DOCUMENTS

| | | |
|---|---|---|
| JP | HEI 2-31225 A | 2/1990 |
| JP | 2-31225 | 2/1990 |
| JP | HEI 2-35545 A | 2/1990 |
| JP | 2-35545 | 2/1990 |
| JP | HEI 3-125246 A | 5/1991 |
| JP | HEI 7-84887 A | 3/1995 |
| JP | 07-084887 | 3/1995 |
| JP | HEI 7-134663 A | 5/1995 |
| JP | 07-134663 | 5/1995 |

* cited by examiner

*Primary Examiner*—Robert Beausoliel
*Assistant Examiner*—Christopher S McCarthy
(74) *Attorney, Agent, or Firm*—Staas & Halsey LLP

(57) ABSTRACT

By disposing a cache registration table (23) for managing the situation of use of each block in the cache to be tested in a cache testing command row creating device (10), for testing the cache in an apparatus to be tested (31), a plurality of testing commands (memory access commands) can be created in which memory access addresses are set randomly and the block to be accessed are set without duplication, so that testing commands not changing in the access priority rank, if cache hit may occur, may be prepared.

8 Claims, 18 Drawing Sheets

METHOD AND APPARATUS FOR TESTING A CACHE

This application is a continuing application, filed under 35 U.S.C. §111(a), of International Application PCT/JP99/00364, filed Jan. 28, 1999, it being further noted that priority is based upon Japanese Patent Application 10-186605, filed Jul. 1, 1998.

TECHNICAL FIELD

The present invention in general relates to a method and apparatus for testing a cache. More particularly, this invention relates to a method and apparatus for testing the cache by using a test command row composed of memory access commands using the cache.

BACKGROUND ART

In the majority of information processing apparatuses manufactured recently, a high speed buffer memory called cache is used in order to enhance the operating speed (to obtain high speed of main memory access). Accordingly, to obtain an information processing apparatus having an excellent performance, it is particularly important to verify that the designed or manufactured cache can operate normally.

Various testing methods are known for verifying the cache. One of such methods is a test called the random command test. An outline of the conventional random command test is explained with reference to FIG. 18.

In the conventional random command test, first of all, pseudo-random numbers are sequentially generated by a random number generating process. Then, by a random command processing, memory access commands having random operands are created with the help of the generated pseudo-random numbers, and the created memory access commands are given to an apparatus to be tested. This apparatus has the cache.

In the conventional random command test, thus, it is designed to verify the cache by creating memory access commands to be accessed randomly by the blocks for composing the cache. In other words, the conventional random command test is a test expecting generation of actions to be verified (for example, replacement sequence) by repetition of random memory access (a test not guaranteeing generation of actions to be verified).

Besides, since the created random command row is redundant, a same action may be repeated plural times in this test. It is hence practically impossible to verify sufficiently the cache with a great number of entries (number of sets) or number of weights applied in the recent information processing apparatus by employing the conventional random command test.

In the light of such background, it is an object of the invention to present a cache testing apparatus and a cache testing method capable of testing the cache in such manner as to access each block for composing the cache without duplication, while maintaining the random performance of memory access.

DISCLOSURE OF THE INVENTION

A cache testing apparatus of the present invention comprises a cache registration table composed of a plurality of blocks corresponding to each one of a plurality of cache entries, with each block assigned with an address registration region for storing an access address of data stored in a corresponding entry, and a flag region for storing information showing validity of test command corresponding to the entry, command creating means for creating memory access commands including information of cache entry, first registering means for registering the access address of the memory access command in the address registration region when the information in the flag region of the block corresponding to the entry indicated by the memory access command created by the command creating means shows an invalid state, and changing the information in the flag region to the information showing validity, and second registering means for selecting a block having a flag region showing an invalid state when the information in the flag region of the block corresponding to the entry indicated by the memory access command shows a valid state, changing the cache entry included in this address to a cache entry corresponding to the selected block, registering the access address information of the memory access command in the address registration region of the selected block, and changing the information in the flag region of the selected block to information showing validity.

According to the above invention, individual blocks of the cache can be verified (initialized) without duplication. Hence, by using this cache testing apparatus, the cache can be verified at high speed and securely.

The cache testing apparatus of the present invention further comprises invalidating means for changing the information in the flag region of each block of the cache registration table to information showing invalidity, first re-registering means for changing the access address of the memory access command to the access address in the address registration region of the block when the flag region of the block corresponding to the cache entry indicated by the memory access command created by the command creating means shows an invalid region, and also changing the information in the flag region to information showing validity, and second re-registering means for selecting the block having a flag region showing an invalid state when the flag region showing invalid state is not present in the block corresponding to the cache entry indicated by the memory access command created by the command creating means, changing the access address of the memory access command to an access address in the address registration region of the selected block, and changing the information in the flag region of the selected block to information showing validity.

According to the above invention, the action in the event of cache hit of the cache can be verified without duplication. Hence, by using this cache testing apparatus, the cache can be verified at high speed and securely.

In the cache testing apparatus of the present invention, each entry of the cache is composed of a plurality of ways, and each block in the cache registration table is assigned, in each way, with address registration region, flag region, and rank information region showing priority rank of ways, and the invalidating means changes the information in the flag region of the way other than the way of the highest priority rank of each block to information showing invalidity.

According to the above invention, of the actions in the event of cache hit of the cache having a plurality of ways, the action in the event of change of the priority rank can be verified in each block without duplication. Hence, by using this cache testing apparatus, the cache having a plurality of ways can be verified at high speed and securely.

The cache testing apparatus of the present invention further comprises comparing means for comparing the information about the access address of the memory access command created by the command creating means and the address information in the address registration region of a specified block, and address reproducing means for creating address information different from the address registration region when there is the address registration region for storing the address information coinciding with the address information of the memory access command in the block, in which the first and second registering means are the means for changing the address information of the block and memory access command to the address information created by the command reproducing means.

According to the above invention, the action of cache error can be verified in each block without duplication in individual blocks of the cache. Hence, by using this cache testing apparatus, the cache can be verified at high speed and securely.

A cache testing method of the present invention is a cache testing method for testing the cache by using a test command row composed of memory access command using the cache, comprising a step of creating a memory access command including information of cache entry, a step of judging whether the test command using the cache entry indicated by the memory access command is registered or not, a step of registering the memory access command as the test command using the cache entry when test command for the entry is not registered, and a step of selecting other cache entry in which test command is not registered when test command using the entry is registered, changing the cache entry indicated by the memory access command to the selected cache entry, and registering the memory access command as the test command using the selected cache entry.

According to the above invention, individual blocks of the cache can be verified (initialized) without duplication. Hence, by using this cache testing method, the cache can be verified at high speed and securely.

The cache testing method of the present invention further comprises a step of invalidating the registered test command, a step of judging whether the test command to the cache entry indicated by the memory access command created at the step of creating the memory access command is invalid or not, and a step of selecting a cache entry in invalid state of test command when the test command to the cache entry is valid, changing the access address of the memory access command to the access address indicated by the test command to the selected cache entry, and re-registering the memory access command as a test command to the selected cache entry.

According to the above invention, the action in the event of cache hit of the cache can be verified without duplication. Hence, by using this cache testing method, the cache can be verified at high speed and securely.

In the cache testing method of the present invention, the entry is composed of a plurality of ways, and it further comprises a step of invalidating the test command registered in each way, a step of changing the access address of the memory access command to the access address indicated by the test command corresponding to the way when there is a test command invalidated way in the cache entry indicated by the memory access command created at the step of creating the memory access command, and re-registering the memory access command as a test command to the way, and a step of selecting the cache entry including the test command invalidated way when there is no way invalidated in test command in the cache entry indicated by the memory access command, changing the access address of the memory access command to the access address of the test command corresponding to the way of the selected cache entry, and re-registering the memory access as the test command corresponding to the way.

According to the above invention, of the actions in the event of cache hit of the cache having a plurality of ways, the action in the event of change of the priority rank can be verified in each block without duplication. Hence, by using this cache testing method, the cache having a plurality of ways can be verified at high speed and securely.

The cache testing method of the present invention further comprises a step of invalidating the registered test command, a step of comparing the access address information indicated by the memory access created at the command creating step with the access address indicated by the test command corresponding to a specified cache entry, an address creating step of creating address information different from the address information when the address information contents coincide with each other, a step of changing the access address of the memory access command by using the address information created at the address creating step when the test command to the cache entry indicated by the memory access command is invalid, and re-registering the memory access command as the test command to the cache entry, and a step of selecting the cache entry in test command invalid state when the test command to the cache entry is valid, changing the access address of the memory access command by using the address information created at the address creating step, and re-registering the memory access command as a test command to the selected cache entry.

According to the above invention, the action in the event of cache error can be verified in each block of the cache without duplication. Hence, by using this cache testing method, the cache having a plurality of ways can be verified at high speed and securely.

BEST MODE FOR CARRYING OUT THE INVENTION

The present invention is described in detail below while referring to the accompanying drawings.

Figure 1:
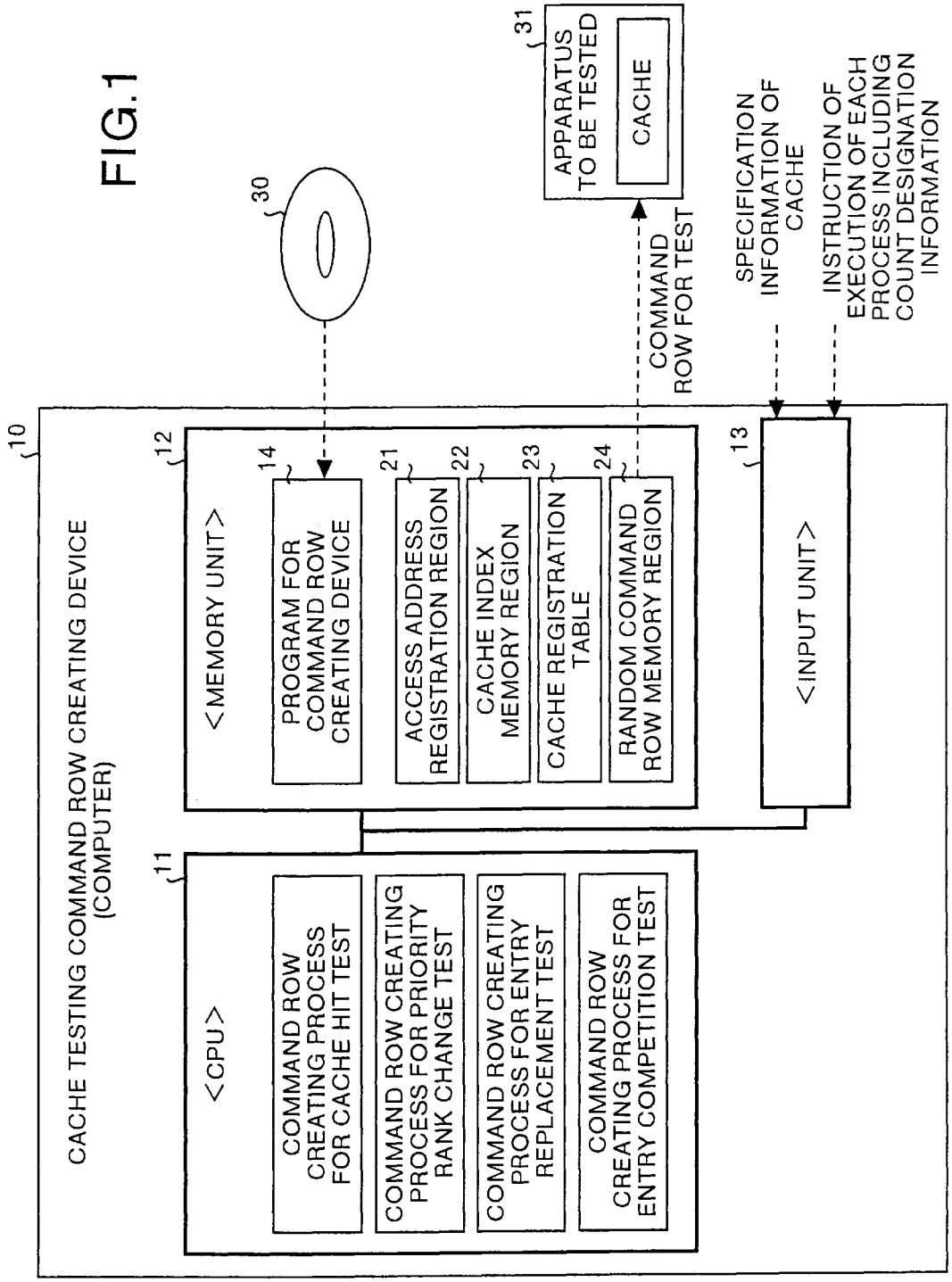
FIG. 1 is a block diagram showing a schematic configuration of a cache testing apparatus of the invention.

FIG. 1 shows a schematic configuration of a command row creating device for cache test included in the cache testing apparatus in an embodiment of the invention. As shown schematically in the diagram, the command row creating device 10 for cache test in the embodiment is a device for creating a command row for testing the cache provided in an apparatus to be tested 31 (information processing apparatus), and it is realized by running a program 14 for command row creating device, which is a program developed for this device, on the computer.

More specifically, through a program recording medium 30, for example, a CD-ROM, the program 14 for command row creating device is stored in a memory unit 12 compared of RAM and others. The CPU 11 operates according to the program 14 for command row creating device, and the computer operates as the command row creating device 10 for cache test.

The processes that can be executed by the CPU 11 while operating according to the program 14 for command row creating device include command row creating process for cache hit test, command row creating process for priority rank change test, command row creating process for entry replacement test, and command row creating process for entry competition test.

The detail is described later. Briefly, the command row creating process for cache hit test is a process of creating a command to cause cache hit without being accompanied by change in the access priority rank, and the command row creating process for priority rank change test is a process of creating a command to cause cache hit being accompanied by change in the access priority rank. The command row creating process for entry replacement test is a process of creating a command for causing cache error (data replacement), and command row creating process for entry competition test is a process of creating a command for causing cache error in a same block right after cache hit (a command for causing access interference state).

Each process requires specification information of the cache to be tested (number of entries (number of sets), number of ways, capacity, replacement method, etc.), and count designation information (detail described later), and the specification information is given to the CPU 11 through the input unit 13 comprising keyboard prior to execution instruction of each process.

Once the specification information is given, the CPU 11 holds an access address registration region 21 of the size suited to the information, a cache index memory region 22, a cache registration table 23, and a random command row memory region 24 in its memory unit 12.

Figure 2:
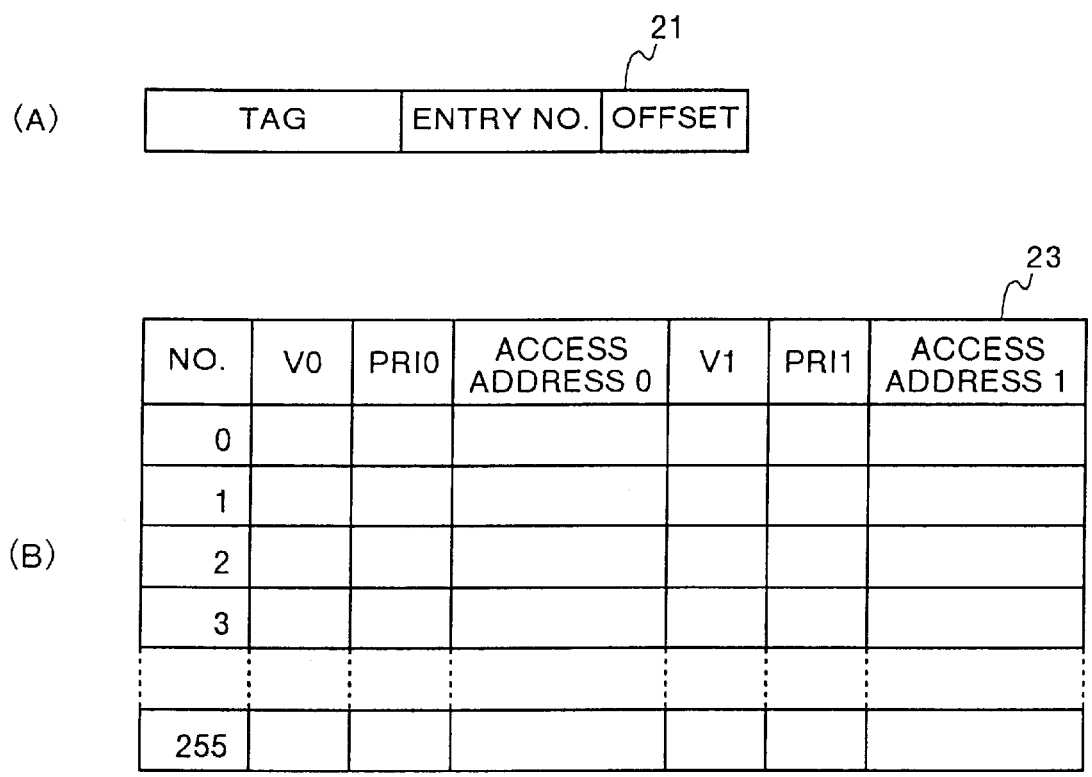
FIG. 2 is an explanatory diagram showing the access address registration region and cache registration table used by the cache testing apparatus of the invention in its operation.

The access address registration region 21 is a region used for temporarily storing the memory access address, and is composed of, as shown in FIG. 2(A), a tag area for storing the data used as tag at the time of cache access, an entry number area for storing the data used as index, and an offset area for storing the data used as offset in the block.

The cache registration table 23 is a table for managing the situation of using the cache and the situation of creating the command row for test. For example, when testing a two-way cache having 256 entries, the cache registration table 23 is a table having 256 entries as shown in FIG. 2(B), and the table has, in each entry, a region for storing V flag, PRI, and access address about way 0, and a region for storing V flag, PRI, and access address about way 1.

Herein, the V flag is the information showing whether the information stored in the corresponding access address registration region is a valid access address or not, or the test command relating to the corresponding block in the cache has been already created or not, by indicating V or I. The PRI is the priority rank information determining the sequence of objects of replacement in the event of cache error. The PRI is an integer ranging from 0 to number of ways−1, and when replacement is necessary, the block of which PRI is 0 is the object of replacement.

These regions are held in both the cache index memory region 22 for storing the cache index used in search of the cache registration table 23, and the random command row memory region 24 for storing the created test command row, and the CPU 11 goes to a state of waiting for input of the information instructing the process to be executed together with the count designation information. Consequently, the CPU 11 starts test command creating process depending on the execution instruction entered in the input unit 13.

The command row creation process for each test executed in the cache testing apparatus of the embodiment will specifically be explained below.

The command row creation process for each test to be executed in the cache testing apparatus of the embodiment is explained below.

Figure 3:
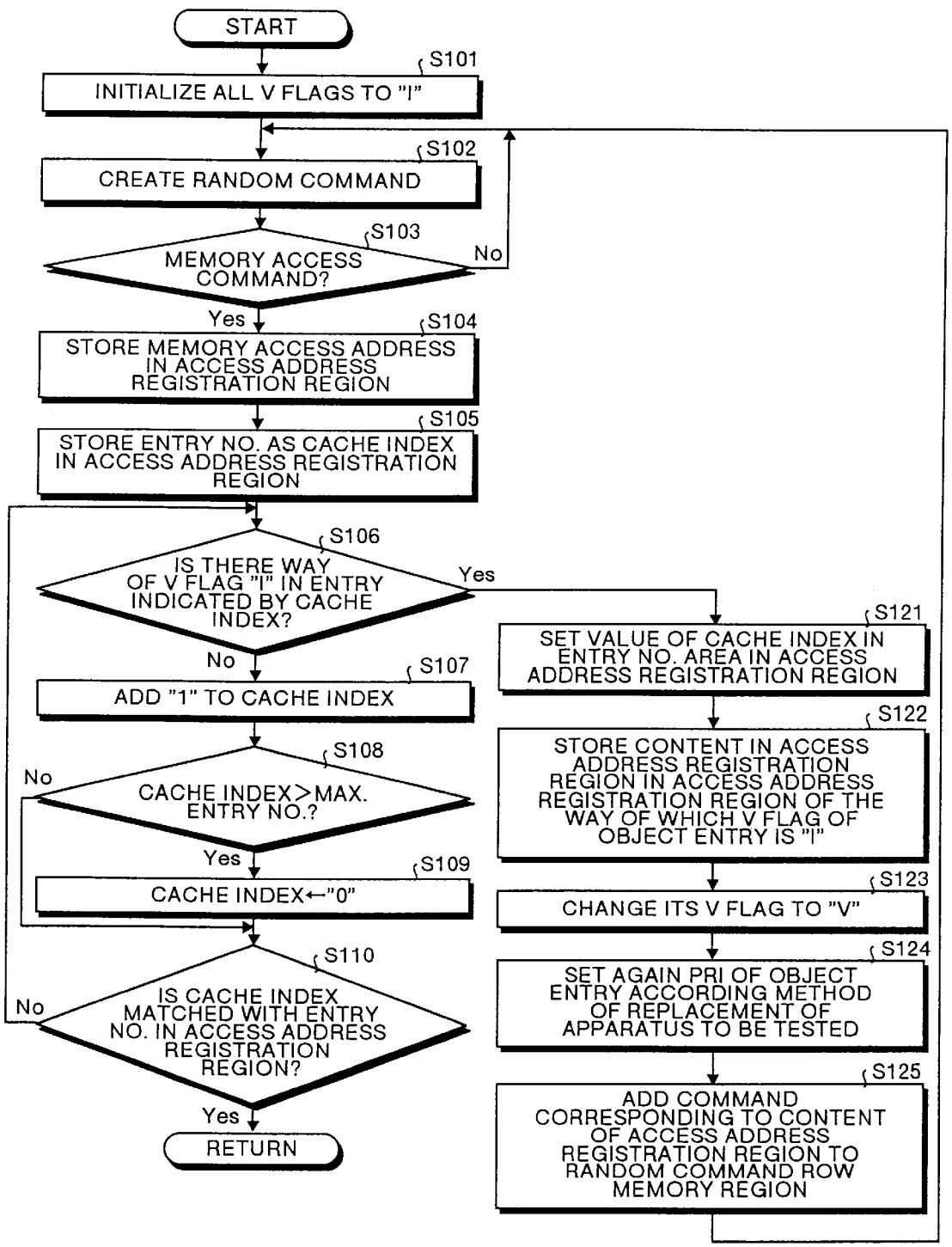
FIG. 3 is a flowchart showing the operation of the command row creating process for initializing the cache executed by the cache testing apparatus of the invention.

As shown in FIG. 3, when starting the command row creating process for initializing the cache, all flags to the cache registration table are initialized to II (step S101). By execution of random command creating process, one random command is created (step S102), and it is judged whether the random command is a memory access command or not (step S103). If the random command is not memory access command (step S103; No), going back to step S102, a new random command is created.

On the other hand, if the random command created at step S102 is a memory access command (step S103; Yes), the memory access address contained in the command is stored in the access address registration region (step S104). The content of the entry number area in the access address registration region is stored in the cache index memory region as cache index (step S105). In the entry indicated by the cache index, it is judged if there is any way of which V flag is I (step S106).

When such way is present (step S106; Yes), the value of the cache index at this moment is set in the entry number area of the access address registration region (step S121). The content of the access address registration region is stored in the access address registration region of the way of which V flag of the object entry is I (step S122), and the V flag corresponding to the access address registration region is changed to V (step S123).

Further, the PRI about the object entry (the entry indicated by the cache index) is set again according to the method of replacement of the apparatus to be tested (step S124). Next, the command having the same command code as the command created by the random command creating process, and also having the content of the access address registration region as the memory access address is added in the random command row memory region (step S125). Process is executed again from step S102.

On the other hand, when such way of which V flag is I is not present in the entry indicated by the cache index (step S106; No), the cache index is incremented by 1 (step S107). It is judged if the cache index is over the maximum entry number (=number of entries−1) or not (step S108), and if exceeding the maximum entry number (step S108; Yes), the value of the cache index is changed to 0 (step S109), and step S110 is executed. If the cache index is smaller than the maximum entry number (step S108; No), step S110 is executed immediately.

At step S110, it is judged whether the cache index and the entry number in the access address registration region are matched or not, and if not matched (step S110; No), process is executed again from step S106. If matched (step S110; Yes), the command row creating process for initializing the cache is terminated.

That is, in the command row creating process for initializing the cache, first, "I" is set in each V flag in the cache registration table corresponding to the cache block to be initialized. Then the memory access command is created randomly, and if there is a block where command for initializing is not created (block of which corresponding V flag is I) in the set of the cache to be utilized by the memory access command, this memory access command is stored in the random command row storage region as the command for initializing this block.

At this time, the memory access address is stored in the access address registration region corresponding to the block of the cache registration table. Further, by changing the corresponding V flag to "V", it is stored that the command for initializing the corresponding block has been already created. In addition, the change in the priority rank occurring when the created command is executed actually is reflected in the PRI value.

If there is no block where command for initializing is not created in the set of the cache to be utilized by the randomly created memory access command, the memory access address (cache index) is changed so that the set to be utilized may be a set including a block where initializing command is not created yet, and then the same process is executed. When processing for creating test commands for all blocks in the cache is over, the command row creating process for initializing the cache is terminated.

Figure 4:
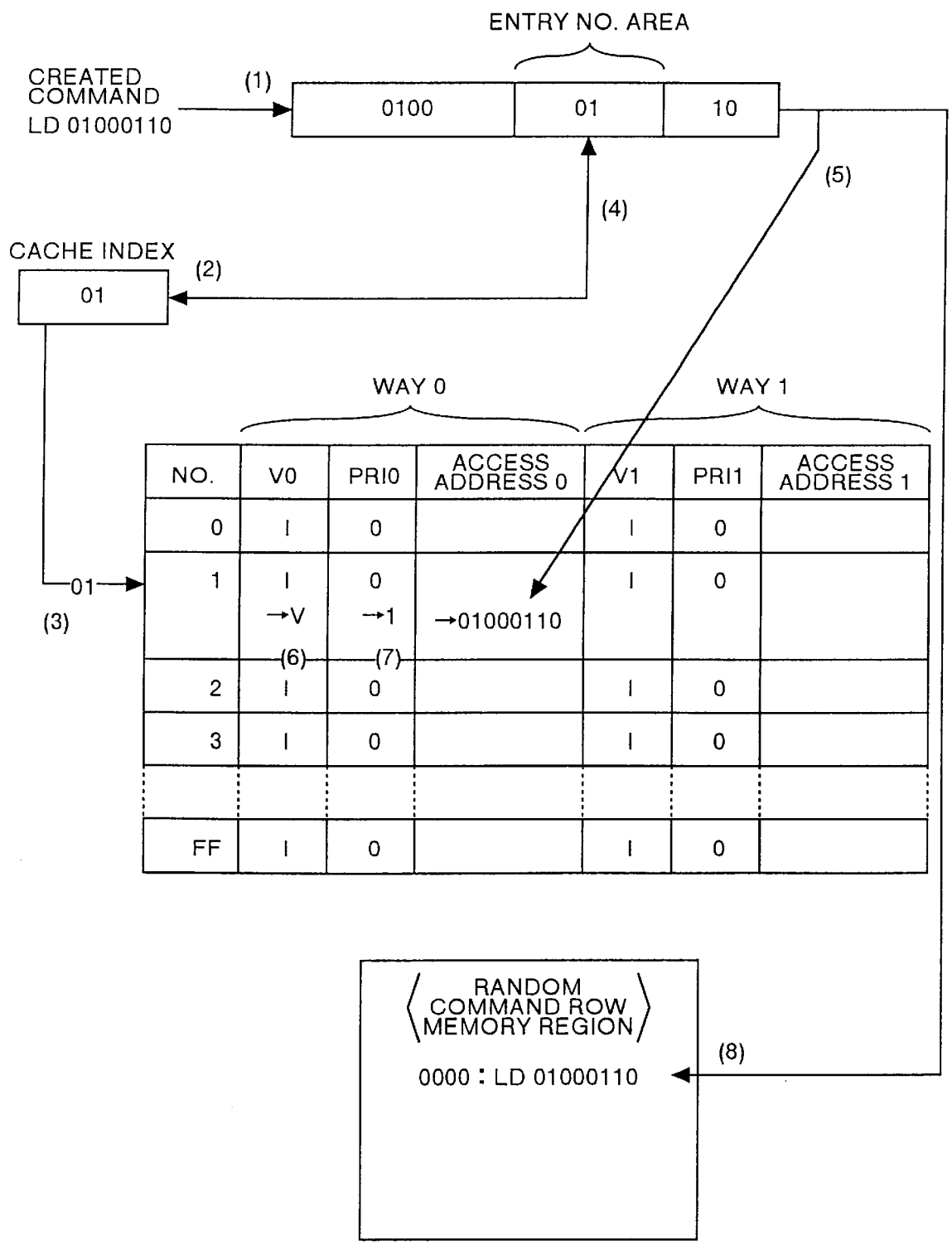
FIG. 4 is an explanatory diagram showing the command row creating process for initializing the cache executed by the cache testing apparatus of the invention.
Figure 5:
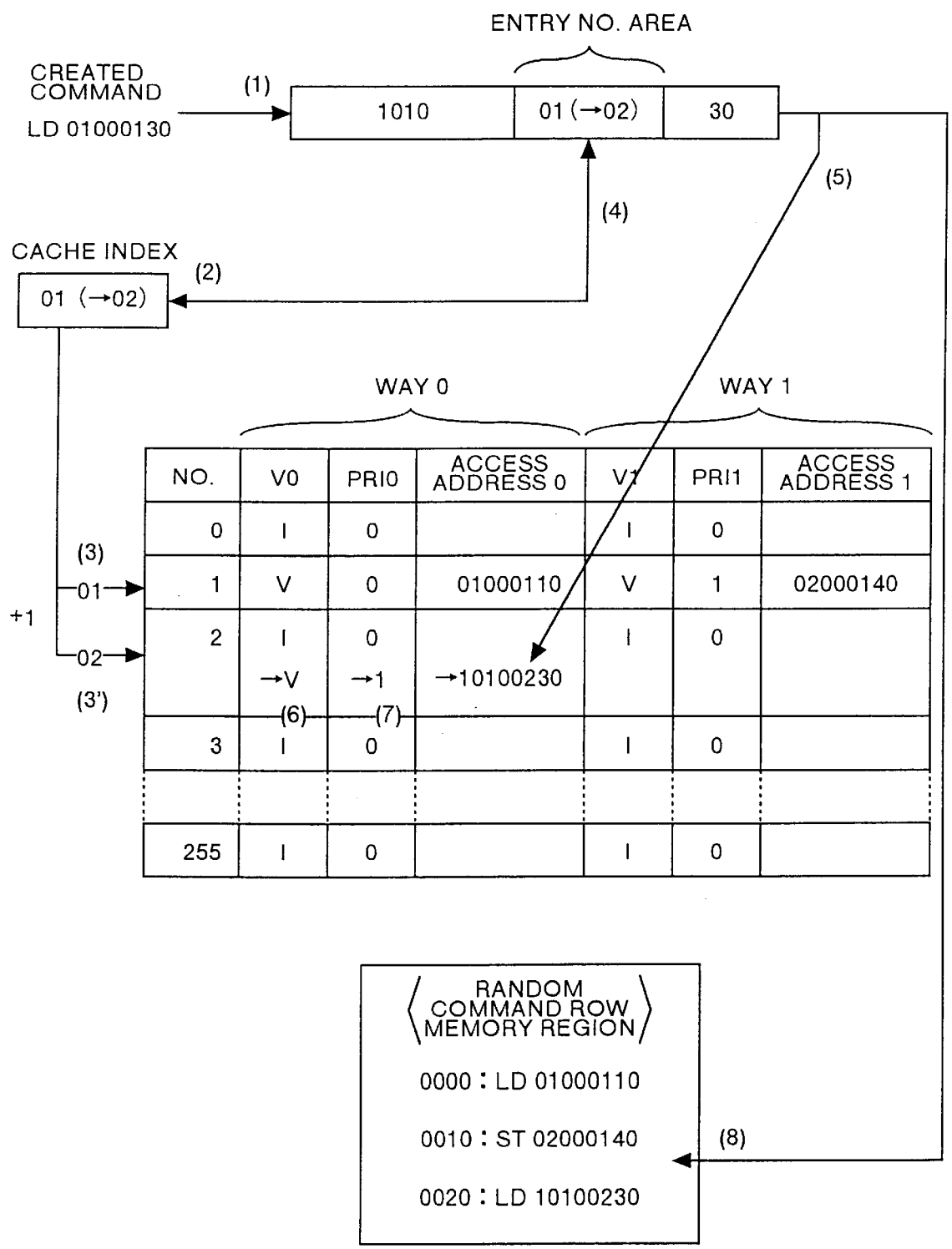
FIG. 5 is an explanatory diagram showing the command row creating process for initializing the cache executed by the cache testing apparatus of the invention.

Referring now to FIG. 4 and FIG. 5, in an example of an apparatus to be tested being an information processing apparatus having 256 entries and two-way cache, the operation of the cache testing apparatus at the time of command row creating process for initializing the cache is explained more specifically below. For the sake of convenience of explanation, it is supposed that the method of replacement employed in the apparatus to be tested is the LRU (least recently used) method. When initializing the V flag, the PRI is entirely initialized to "0", and PRI values of two ways relating to a certain entry are both "0", and in this case it is supposed that way 0 is used.

In such circumstance, after completion of initialization of all V flags in the cache registration table, suppose three memory access commands "LD 01000110", "ST 02000140", and "LD 10100130" are created in this sequence.

In this case, concerning the first memory access command "LD 01000110", as shown schematically in FIG. 4, its memory access address "01000110" is stored in the access address registration region (1), and the content "01" of the entry number area in the access address region is stored in the cache index memory region as cache index (2).

Next, in the two ways of the entry indicated by the cache index (that is, the entry of entry number 1), it is judged if there is any way of which V flag is "I" (3). In this case, both V0 and V1 relating to the entry of entry number 1 are "I", and therefore without changing the value of the cache index, updating of the content of the cache registration table and addition of command to the random command row memory region (processes at steps S121 to S125) are executed.

That is, the value of the cache index at this moment is stored in the entry number area of the access address registration region (4: since the value of the cache index is not changed, the value of the entry number is not changed). As the access address 0 of the entry of entry number 1, the content in the access address registration region, that is, "01000110" is stored (5). Further, the V flag V0 about way 0 of entry number 1 is changed to "V" (6), and PRI0 of the PRI relating to way 0 of entry number 1 is changed to "1" (7). In the random command row memory region, the command having the same command code (LD) as the command created in the random command creating process and having the content in the access address registration region as the memory access address, "LD 01000110" (in this case, the same command as the command created in the random command creating process), is stored (8).

Concerning the next memory access command "ST 02000140", since the V flag V1 about the way 1 of the entry indicated by the entry number area value "01" is "I", without changing the value of the cache index, updating of the content in the cache registration table and adding of command into the random command row memory region are executed. More specifically, the access addresses 1, V1 about the entry of entry number 1 are respectively "02000140" and "V", and RPI0 and PRI1 are respectively "0" and "1". In the random command row memory region, the same command "ST 02000140" as the command created in the random command creating process is stored.

Afterwards, when the memory access command "LD 10100130" is created, as shown schematically in FIG. 5, its memory access address "10100130" is stored in the access address registration region (1). The content "01" in the entry number area of the access address registration region is stored in the cache index memory region as cache index (2).

Next, in the two ways of the entry indicated by the cache index (that is, the entry of entry number 1), it is judged if there is any way of which V flag is "I" (3). In this case, since both V0 and V1 relating to the entry of entry number 1 are "V", the value of the cache index is incremented by one, and, in the two ways of the entry indicated by the cache index after increment (that is, the entry of entry number 22), it is judged if there is any way of which V flag is "I" (3'). In this case, since there is a way of which V flag is "I" in the entry of entry number 2, the process after step S121 is executed by using the cache index "02".

That is, the cache index "02" at this moment is stored in the entry number area of the access address registration region (4). As the access address 0 of the entry of entry number 2, the content in the access address registration region, that is, "10100230" is stored (5). Further, the V flag V0 about way 0 of entry number 2 is changed to "V" (6), and the corresponding PRI0 1 is changed to "1" (7). In the random command row memory region, the command having the same command code (LD) as the command created in the random command creating process and having the content in the access address registration region as the memory access address, "LD 10100230", is stored (8).

Figure 6:
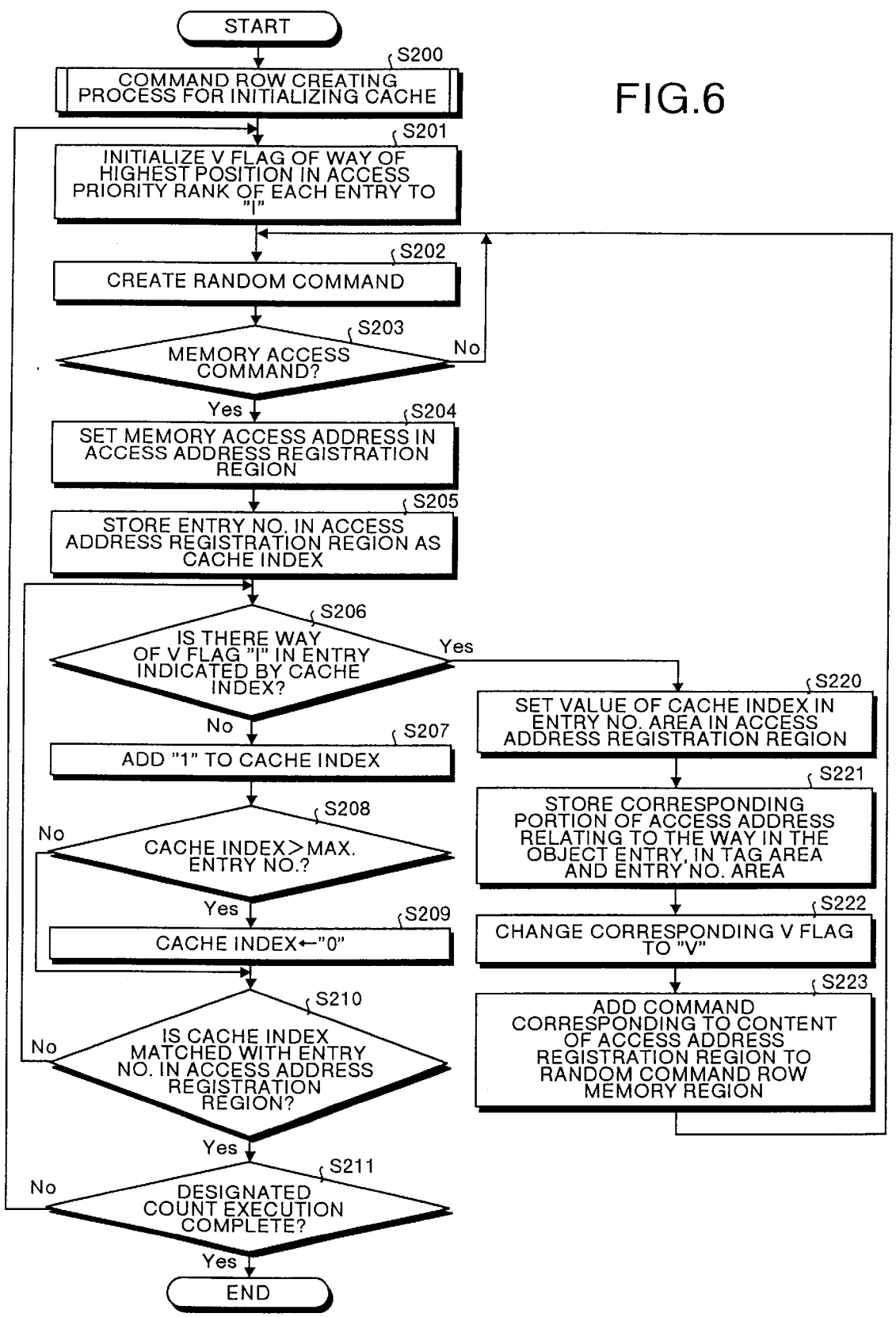
FIG. 6 is a flowchart showing the operation of command row creating process for cache hit test executed by the cache testing apparatus of the invention.

The operation in the command row creating process for cache hit test of the cache testing apparatus is explained. As shown in FIG. 6, at the time of the command row creating process for cache hit test, first, the command row creating process for initializing the cache as mentioned above is executed (step S200). That is, all flags in the cache registration table are "V", and the state of storing the valid addresses in the access address region is achieved.

Then the V flag of the highest position of the access priority rank in each entry is initialized to "I" (step S201). Later, by execution of the random command creating process, one command is created (step S202), and it is judged if this command is a memory access command or not (step S203). If the random command is not memory access command (step S203; No), going back to step S202, a new random command is created.

If the random command created at step S202 is a memory access command (step S203; Yes), the memory access address contained in the command is stored in the access address registration region (step S204). The entry number in the access address registration region is stored in the cache index memory region as cache index (step S205).

In the V flag of the entry indicated by the cache index, it is judged if there is any V flag in which "I" is set (step S206). When such V flag is not present (step S206; No), the cache index is incremented by one (step S207). It is then judged if the value of the cache index is over the maximum entry number or not, and if the value of the cache index exceeds the maximum entry number (step S208; Yes), the value of the cache index is changed to "0" (step S209), and step S210 is executed. If the cache index is smaller than the maximum entry number (step S208; No), step S210 is executed immediately.

At step S210, it is judged whether the cache index and the entry number in the access address registration region are matched or not. If not matched (step S210; No), process is executed again from step S206.

When there is a way of which V flag is "I" in the way of the entry indicated by the cache index (step S206; Yes), the value of the cache index is set in the entry number area of the access address registration region (step S220). Consequently, in the tag area and entry number area of the access address registration region, the corresponding portion in the access address registration region of the way of which V flag of the object entry is "I" is stored (step S221), and its V flag is changed to "V" (step S222). Then, in this random command row memory region, the command having the same command code as the command created in the random command creating process and having the content in the access address registration region as the memory access address is stored (step S223). Process is executed again from step S202.

When the cache index and the entry number in the access address registration region are matched (step S210; Yes), that is, when all V flags become "V", it is judged if execution of specified number of processes of step S202 to S210 and S221 to S223 (the number of times indicated by count designation information) has been completed or not, and if not completed (step S211; No), process is executed again from step S201, and if completed (step S211; Yes), the command row for cache hit test is terminated.

That is, in the command row creating process for cache hit test, first, by the execution of the command row creating process for initializing the cache, a command row is created so that all blocks in the caches are accessible, and the information for recognizing the state of the cache after execution of this command row is set in the cache registration table. Then "I" is set in each V flag corresponding to the block to be tested (the block in which cache hit occurs, but the access priority rank is not changed).

Consequently, memory access commands are created randomly, and in the set of the caches utilized by such memory access commands, if there is a block where the test command is not created yet (the block in which the corresponding V flag is "I"), the memory access commands are stored in the random command row memory region. In the cache registration table, the memory access address is stored in the access address registration region corresponding to the block, and by changing the corresponding V flag to "V", it is stored that the command for testing this block has been already created.

On the other hand, if the set of the caches to be utilized by such randomly created memory access commands does not contain a block where the test command is not created yet, the same process is done after the memory access address (cache index) is changed so that the set to be utilized may contain a block where the test command is not created yet.

When the processing for creating the commands for the number of sets of the cache is executed for a designated number of times, the command row creating process for cache hit test is terminated.

By referring to an example for testing the cache of the same specification as used in explanation of the command row creating process for initiating the cache, the command row creating process of cache hit test is more specifically described below in relation to FIG. 7 and FIG. 8.

Figure 7:
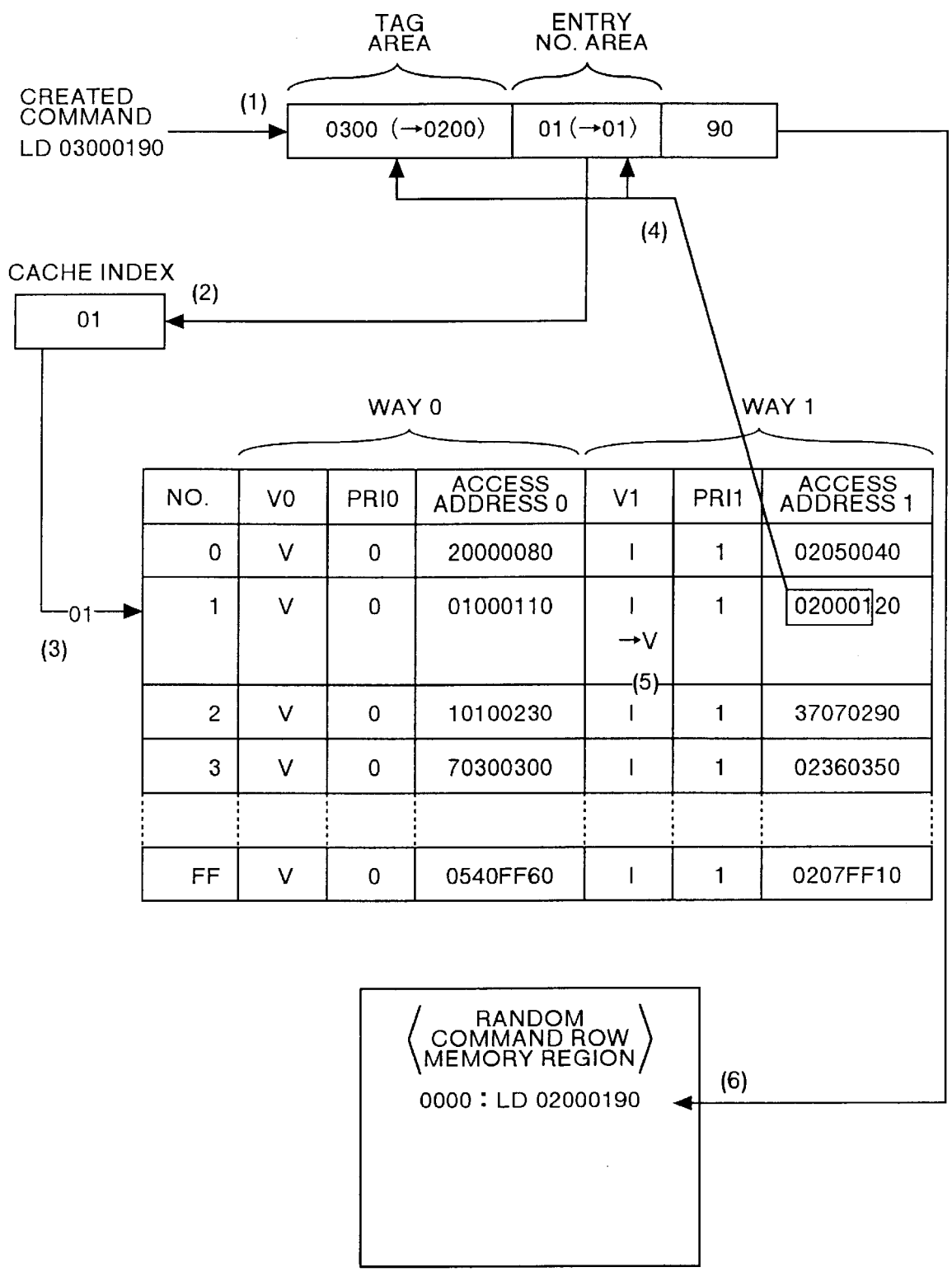
FIG. 7 is an explanatory diagram showing the command row creating process for cache hit test executed by the cache testing apparatus of the invention.

In the command row creating process for cache hit test, after initializing all V1 in the cache registration table to "I", if the first created memory access command is "LD 03000190", the cache registration table is processed in the following procedure as schematically shown in FIG. 7.

That is, the memory access address "03000190" is stored in the access address registration region (1), and the content "01" of the entry number area in the access address region is stored in the cache index memory region as cache index (2).

Next, in the two ways of the entry indicated by the cache index (that is, the entry of entry number 1), it is judged if there is any way of which V flag is "I" (3). In this case, since V1 is "I", the corresponding portion ("020001") of the access address 1 of the entry of enter number 1 is stored in the tag area and entry number area of the access address registration region (4). Consequently, the V flag V1 about way 1 of entry number 2 is changed to "V" (5). In the random command row memory region, the command "LD 02000190" having the same command code (LD) as the command created in the random command creating process and having the content in the access address registration region as the memory access address is stored (6).

Figure 8:
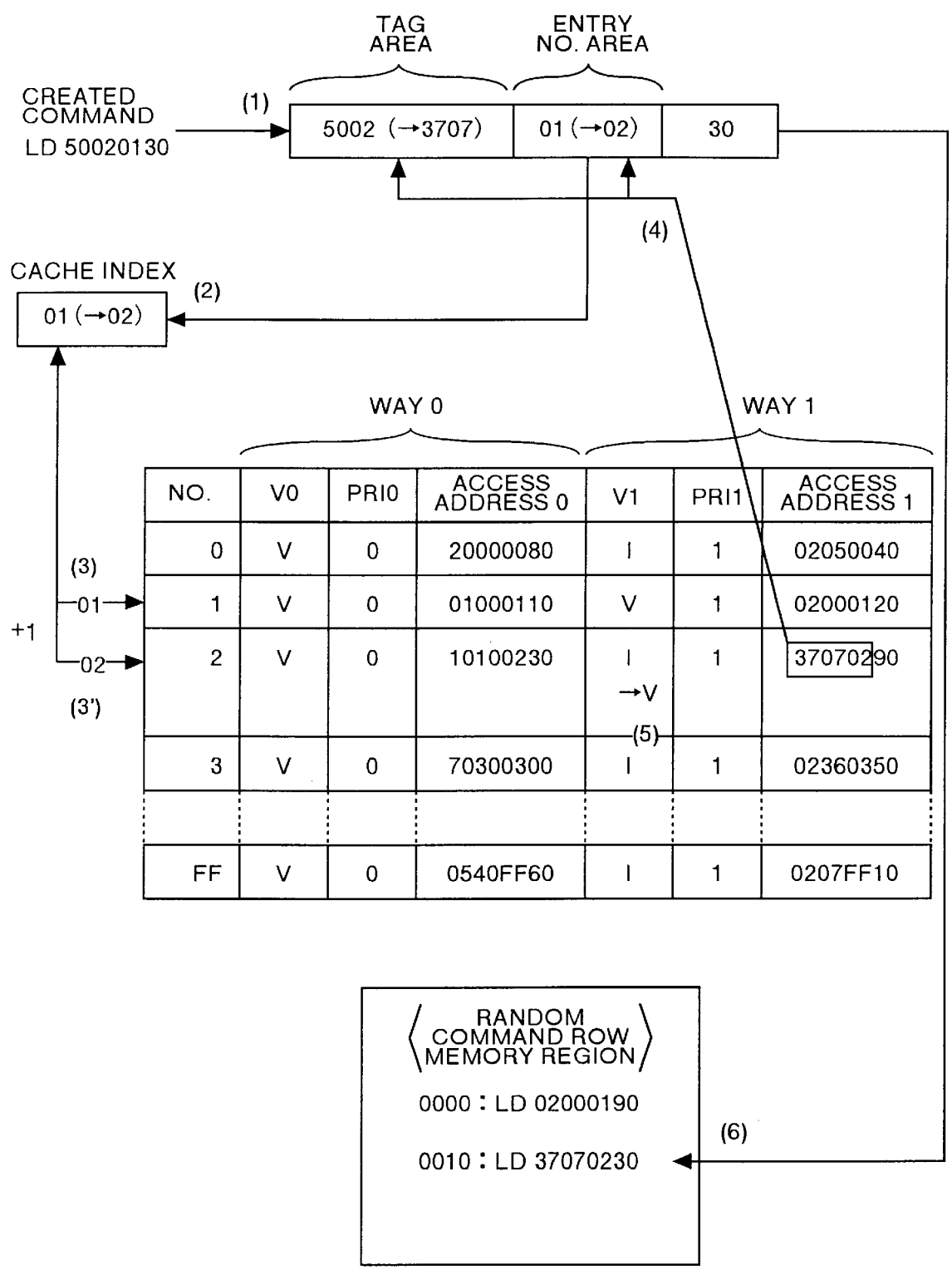
FIG. 8 is an explanatory diagram showing the command row creating process for cache hit test executed by the cache testing apparatus of the invention.

Afterward, if "LD 50020130" is created, as schematically shown in FIG. 8, "50020130" is stored in the access address registration region (1), and the content "01" of the entry number area in the access address registration region is stored as cache index (2).

Next, in the V flags of two ways of the entry indicated by the cache index (that is, the entry of entry number 1), it is judged if there is any V flag where "I" is set (3). In this case, there is no V flag with "I" in the entry of entry number 1. Accordingly, "1" is added to the cache index. It is then judged if there is any way of which V flag is "I" in the two ways of the entry indicated by the updated cache index (the entry of entry number 2) (3').

At this moment, since V1 of entry of entry number 2 is "I", the corresponding portion "370702" of the access address 1 of the entry of entry number 2 is stored in the tag area and entry number area of the access address registration region (4), and the V flag about the entry of entry number 2 is changed to "V" (5). In the random command row memory region, the command "LD 37070230" having the same command code (LD) as the command created in the random command creating process and having the content of the access address registration region as the memory access address is stored (6).

Figure 9:
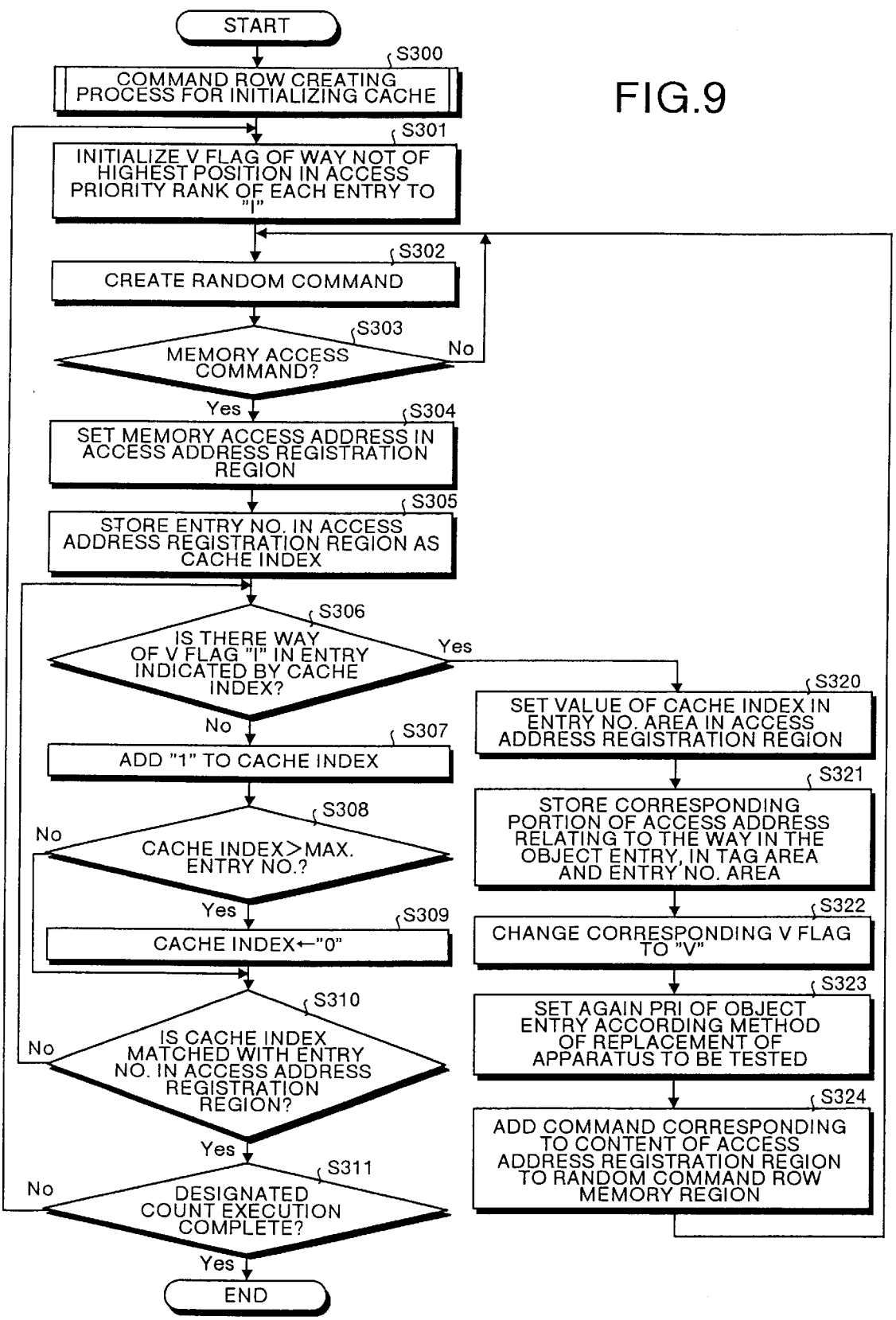
FIG. 9 is a flowchart showing the operation of command row creating process for priority rank change test executed by the cache testing apparatus of the invention.

FIG. 9 shows the operating procedure in command row creating process for priority rank change test in the cache testing apparatus.

As clear from the diagram, steps S300, S302 to S311 in the command row creating process for priority rank change test are same processes as steps S200, S202 to S211 in the command row creating process for cache hit test (see FIG. 6). Herein, only other steps are explained.

At step S301 after execution of initializing process of cache registration table, the V flag of the way not highest in the access priority rant of each entry in the cache registration table is initialized to "I". If there is a way with V flag being "I" in the ways of the entry indicated by the cache index (step S306; Yes), the value of the cache index is set in the entry number area of the access address registration region (step S320).

Consequently, in the tag area and entry number area of the access address registration region, the corresponding portion of the access address registration region in which the V flag of object entry is "I" is stored (step S321), and this V flag is changed to "V" (step S322). The PRI relating to the object entry is set again according to the method of replacement of the apparatus to be tested (step S323). In the random command row memory region, the command having the same command code as the command created in the random command creating process and having the content of the access address registration region as the memory access address is stored (step S324). Then, process is executed again from step S302.

That is, in the command row creating process for priority rank change test, in the first place, by execution of the command row creating process for initializing the cache, the command row accessed by all blocks in the cache is created, and the information for understanding the state of the cache after execution of the command row is set in the cache registration table. As a result, "I" is set in each V flag corresponding to the cache block (the blocks excluding the block of the highest position of the priority rank) varying in the access priority rank when utilized.

In the set to be utilized by the memory access commands created randomly, if there is a block where the command for changing the priority rank state is not created yet (any block of which corresponding V flag is "I"), by making use of the memory access command utilizing such block, it is judged if it is a command for cache hit or not. Also by varying the corresponding V flag to "V", it is stored that the command for changing the priority rank state has been already created in the corresponding block, and the change of the access priority rank occurring when the created command is executed actually is reflected in the PRI value.

In the set to be utilized by the memory access commands created randomly, if there is no block where the command for changing the priority rank state is not created yet, a same process is done after the memory access address (cache index) is changed so that the set to be utilized may be a set having a block where such command is not created yet. When the process for creating the command for the portion of all blocks in the cache is executed for the specified number of times, the command row creating process for priority rank change test is terminated.

By referring to an example for testing the cache of the same specification as used in explanation of the command row creating process for initiating the cache, the command row creating process of priority rank change test is more specifically described below in relation to FIG. 10 and FIG. 11.

Figure 10:
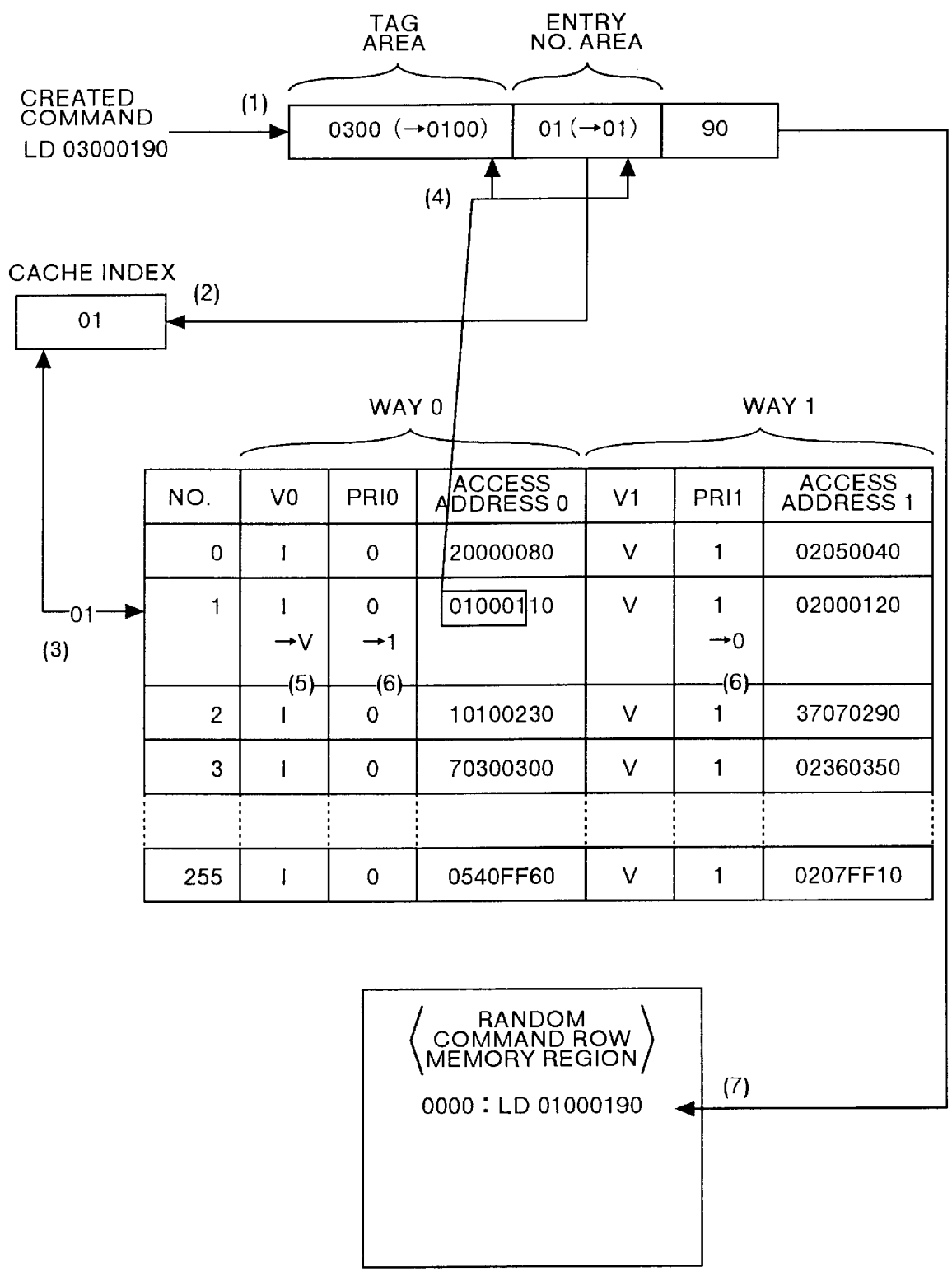
FIG. 10 is an explanatory diagram showing the command row creating process for priority rank change test executed by the cache testing apparatus of the invention.

In the command row creating process for priority rank change test, after initializing all V0 in the cache registration table, if the first created memory access command is "LD 03000190", the cache registration table is processed in the following procedure as schematically shown in FIG. 10.

That is, the memory access address "03000190" is stored in the access address registration region (1), and the content "01" of the entry number area is stored in the cache index memory region (2).

Next, in the two ways of the entry indicated by the cache index (that is, the entry of entry number 1), it is judged if there is any way of which V flag is "I" (3). In this case, since V0 is "I", the corresponding portion ("010001") of the access address 0 of the entry of enter number 1 is stored in the tag area and entry number area of the access address registration region (4). Consequently, the V flag V0 about way 0 of entry number 1 is changed to "V" (5), and PRI0 and PRI1 of the entry of entry number 1 are see again (6). In the random command row memory region, the command "LD 01000190" having the same command code (LD) as the command created in the random command creating process and having the content in the access address registration region as the memory access address is stored (7).

Figure 11:
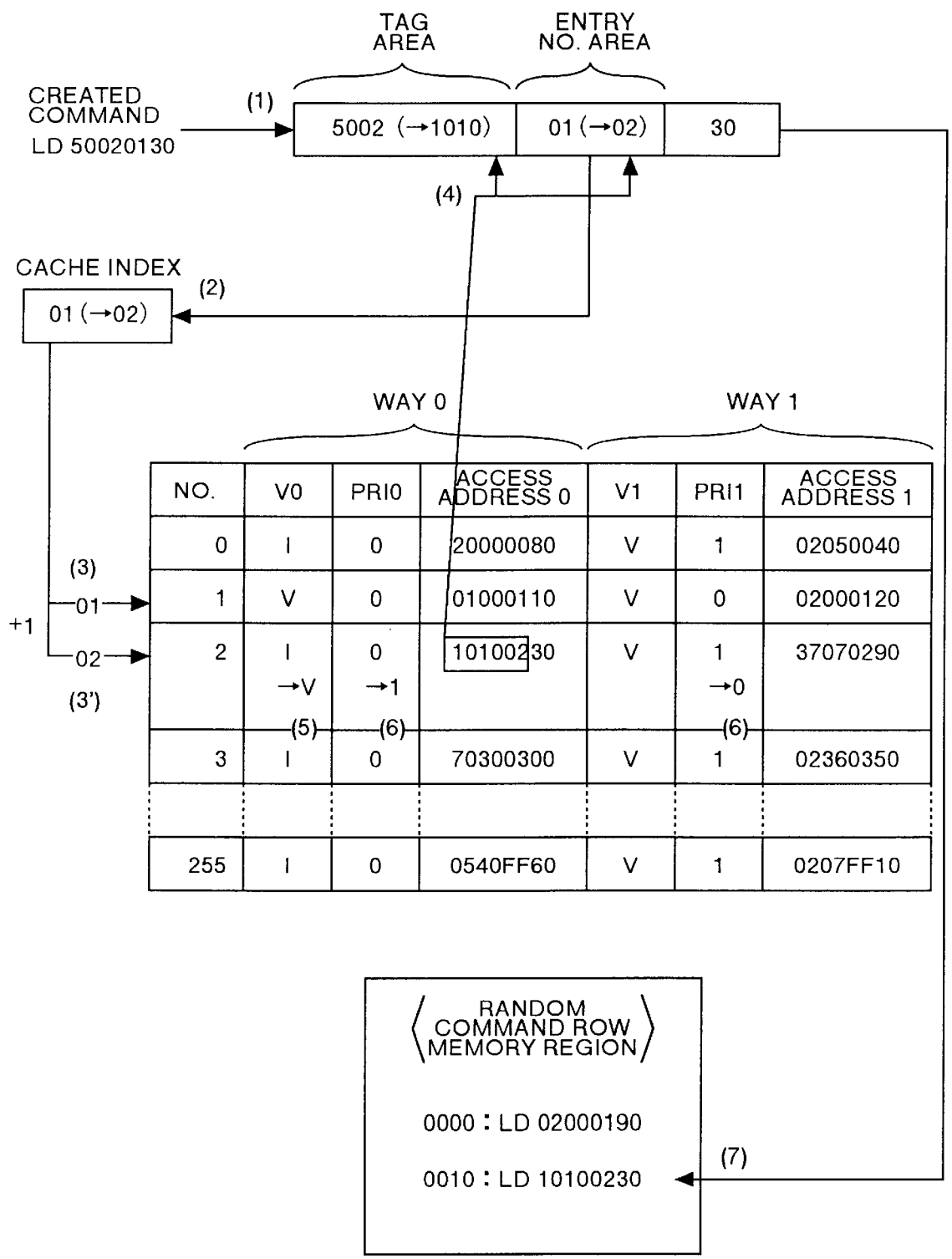
FIG. 11 is an explanatory diagram showing the command row creating process for priority rank change test executed by the cache testing apparatus of the invention.

Afterward, if "LD 50020130" is created, as schematically shown in FIG. 11, "50020130" is stored in the access address registration region (1), and the content "01" of the entry number area in the access address registration region is stored as cache index (2).

Next, in the two ways of the entry of entry number 1 indicated by the cache index, it is judged if there is any V flag of "I" (3). In this case, there is no V flag with "I" in the entry of entry number 1, "1" is added to the cache index. It is then judged if there is any way of which V flag is "I" in the two ways of the entry indicated by the updated cache index (the entry of entry number 2) (3').

At this moment, since V1 of entry of entry number 2 is "I", the corresponding portion "101002" of the access address 0 of the entry of entry number 2 is stored in the tag area and entry number area of the access address registration region (4). The V flag V0 about the entry of entry number 2 is changed to "V" (5), and PRI0 and PRI1 of the entry of entry number 1 are set again (6). In the random command row memory region, the command "LD 10100230" having the same command code (LD) as the command created in the random command creating process and having the content of the access address registration region as the memory access address is stored (7).

Figure 12:
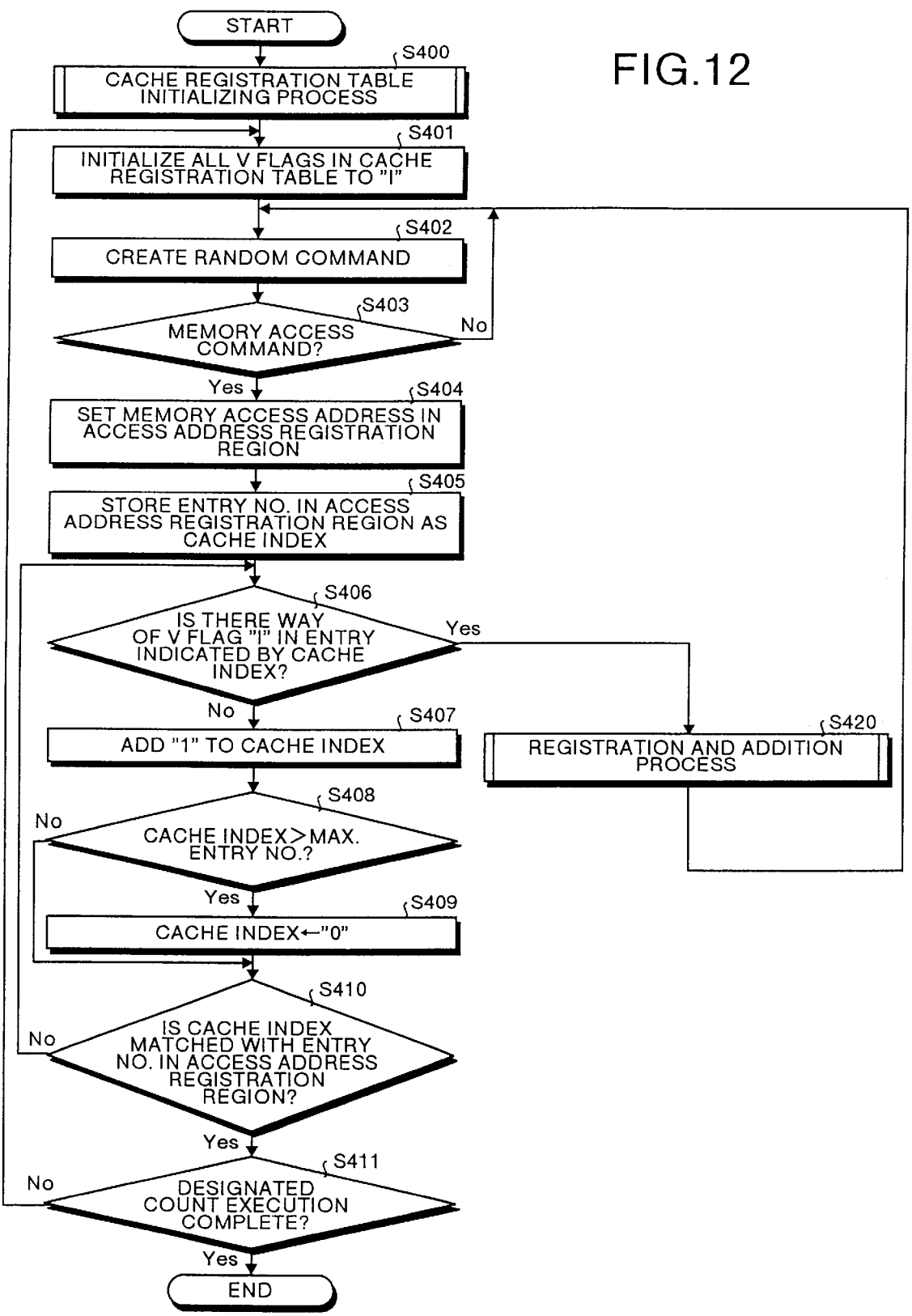
FIG. 12 is a flowchart showing the operation of command row creating process for entry replacement test executed by the cache testing apparatus of the invention.
Figure 13:
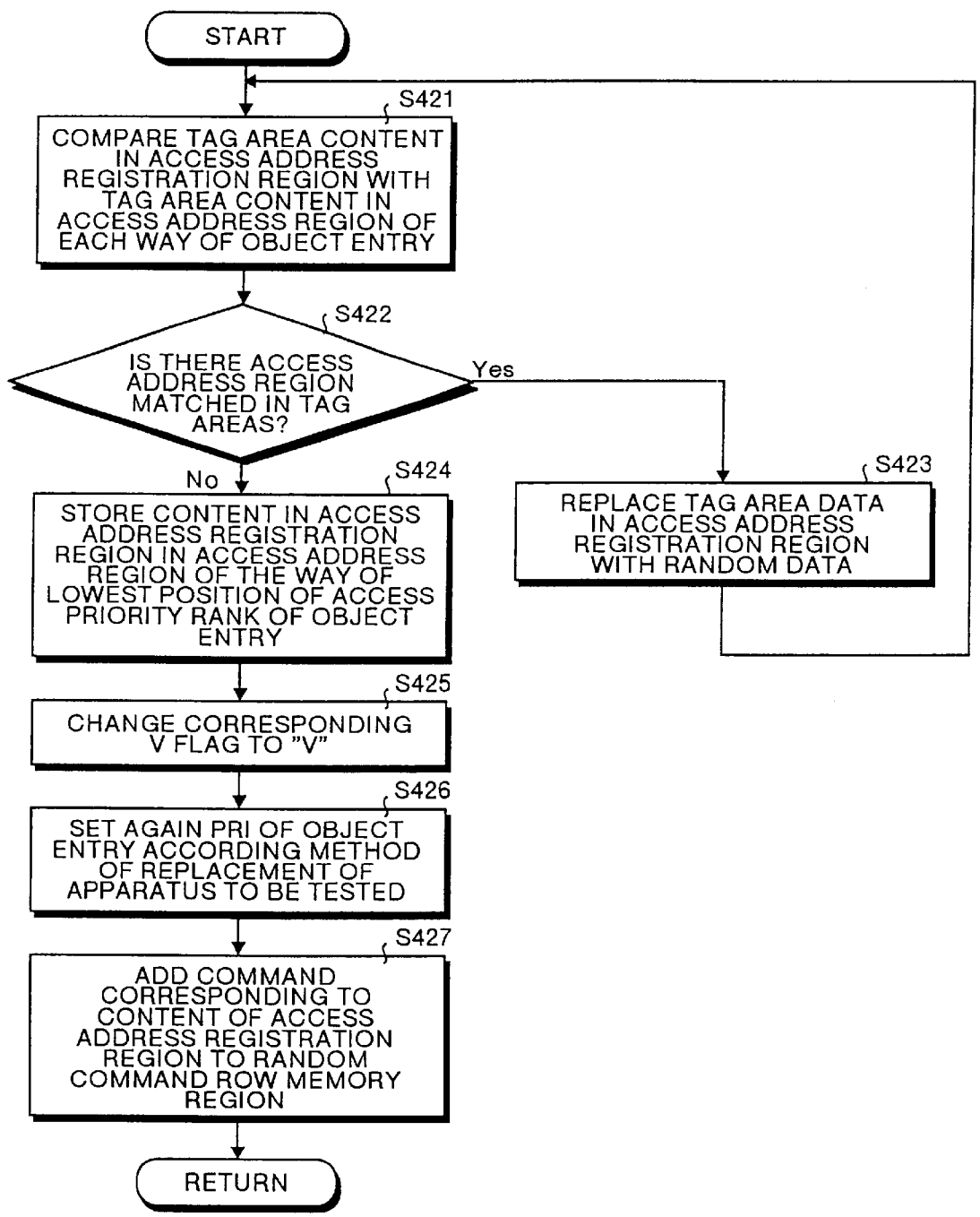
FIG. 13 is a flowchart showing the operation of registration and addition process executed in command row creating process for entry replacement test executed by the cache testing apparatus of the invention.

FIG. 12 shows a general flowchart of command row creating process for entry replacement test, and FIG. 13 shows a flowchart for registration and addition process to be executed in command row creating process for entry replacement test.

As clear from FIG. 12, steps S400, and S402 to S411 are same as steps S200 and S202 to S211 of command row creating process for cache hit test (see FIG. 6). Only different steps are explained below.

At step S401 after execution of initializing process of cache registration table, all V flags in the cache registration table are initialized to "I". In the registration and addition process corresponding to the process at steps S221 to S223, as shown in FIG. 13, first the content in the tag area in the access address registration region and the content in the tag area in the access address registration region of each way of the object entry are compared (step S421). If there is an access address registration region matching in the contents in the tag areas (step S422; Yes), the data in the tag area in the access address registration region is replaced with random data (step S423). Going back to step S421, the contents in the tag areas are compared again.

By comparison at step S421, if it is confirmed that there is no access address registration region matching in the contents in the tag areas (step S422; No), the content in the access address registration region is stored in the access address registration region of the way at the lowest position of the access priority rank in the object entry (step S424). As a result, the V flag corresponding to this access address registration region is changed to "V" (step S425). Further, the PRI relating to the object entry is set again corresponding to the replacement method of the apparatus to be tested (step S426), and the command corresponding to the content in the access address registration region is added in the random command row memory region (step S427). Going back to step S402, process about the newly created command is started.

That is, in the command row creating process for entry replacement test, first, by execution of command row creating process for initializing the cache, a command row for making accessible all blocks in the cache is created, and the information for understanding the state of the cache after execution of this command row is set in the cache information table. Then "I" is set in each V flag corresponding to the cache block to be replaced. In the set of the cache to be utilized by the memory access commands created randomly, if there is a block where the command for replacement is not created yet (the block of which corresponding V flag is "I"), it is judged if this memory access command is the command of cache hit or not.

If this command is the command of cache hit, the command is corrected to a command of not doing cache hit in which the same block is used, and if it is not a command of cache hit, it is directly stored in the random command row memory region. Further, by changing the corresponding V flag to "V", it is stored that the command for replacing the corresponding block is has been already created, and the change in the access priority rank occurring at the time of actual execution of the created command is reflected in the PRI value.

In the set of the cache to be utilized by the memory access commands created randomly, if there is no block where the command for replacement is not created yet, the memory access address (cache index) is changed so that the set to be utilized may be the set including a block not having the command for replacement, and then the same process is executed.

When the process for creating the commands for all blocks in the cache is executed for a specified number of times, the command row creating process for entry replacement test is terminated.

Relating to an example of test of the cache of the same specification as used in explanation of command row creating process for initializing the cache, the command row creating process for entry replacement test is more specifically described below.

Figure 14:
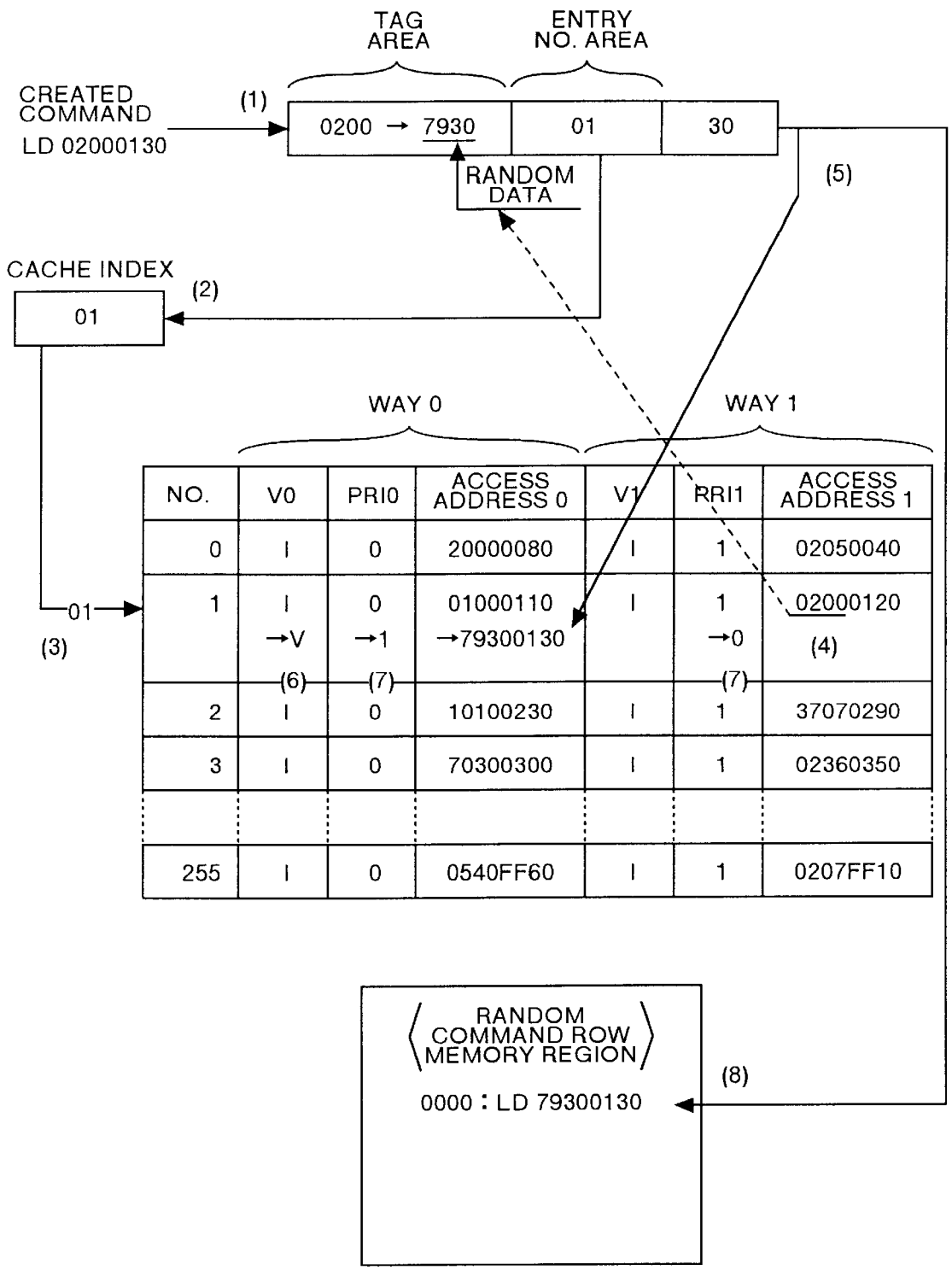
FIG. 14 is an explanatory diagram showing the command row creating process for entry replacement test executed by the cache testing apparatus of the invention.

In the command row creating process for entry replacement test, after completion of initialization of all V flags in the cache registration table, if the first created memory access command is "LD 02000130", the procedure as schematically shown in FIG. 14 is processed in the cache registration table.

That is, the memory access address "02000130" is stored in the access address registration region (1), and the content "01" of the entry number area is stored in the cache index memory region (2). In the access address about two ways of the entry indicated by this cache index (that is, the entry of entry number 1), it is judged if there is tag area content of "0200" or not (3). In the shown case, since the tag area content of the access address 1 coincides with the tag area content in the access address registration region, the tag area content in the access address registration region is replaced by random data (7930) (4).

In the access address relating to the entry of entry number 1, after it is known that there is no access address of tag area content of 7930 (not shown), since V0 is "I" in this case, the access address 0 of the entry of entry number 1 is replaced by the content in the access address registration region (5). Further, the V flag V0 relating to the entry of entry number 1 is replaced by "V" (6). And, PRI0 and PRI1 of the entry of entry number 1 are set again (7). In the random command row memory region, the command "LD 079300130" having the same command code (LD) as the command created in the random command creating process and having the content in the access address registration region as memory access address is stored (8).

The operating procedure in the command row creating process for entry competition test of the cache testing apparatus is same as the operating procedure in command row creating process for priority rank change test except that the content of the process to be executed as registration and addition process is different. Accordingly, only the registration and addition process to be executed in command row creating process for entry competition test is explained.

Figure 15:
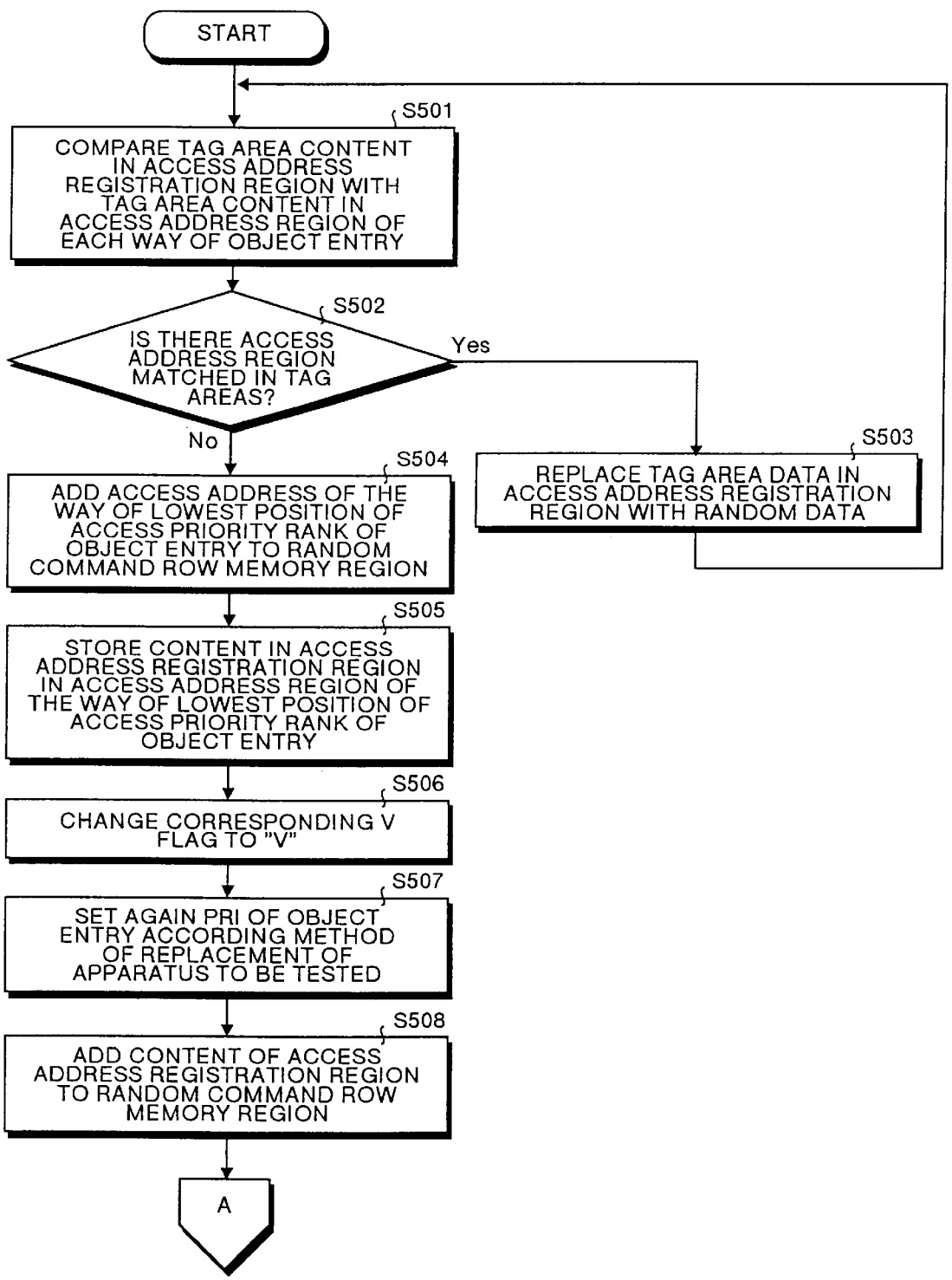
FIG. 15 is a flowchart showing the operation of registration and addition process executed in command row creating process for entry competition test executed by the cache testing apparatus of the invention.
Figure 16:
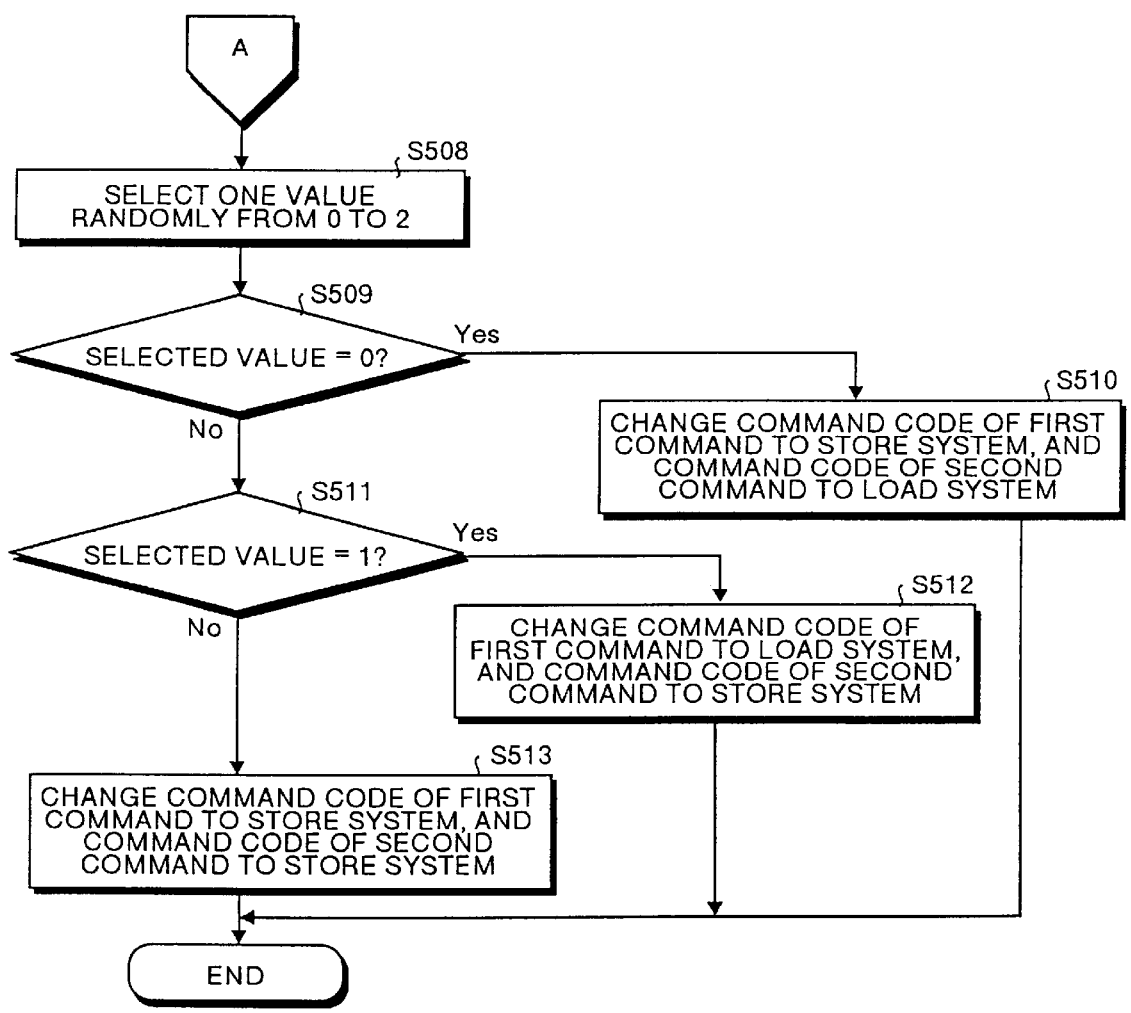
FIG. 16 is a flowchart showing the operation of registration and addition process executed in command row creating process for entry competition test executed by the cache testing apparatus of the invention.

FIG. 15 and FIG. 16 show flowcharts of registration and addition process to be executed in command row creating process for entry competition test. As shown in FIG. 15, in registration and addition process, in the first place, the tag area content in the access address registration region and the tag area content in the access address registration region in each way of the object entry are compared (step S501). If there is an access address registration region matching in the tag area contents (step S502; Yes), the tag area data in the access address registration region is replaced by the random data (step S503). Going back to step S501, the tag area contents are compared again.

By comparison at step S501, when it is known that there is no access address registration region matching in the tag area contents (step S502; No), the access address of the way of the lowest position in the access priority rank in the object entry is added to the random command row memory region (step S504). Then the content in the access address registration region is stored in the access address registration region of the way of the lowest position in the access priority rank in the object entry (step S505).

Consequently, the V flag corresponding to this access address registration region is changed to "V" (step S506). Further, the PRI relating to the object entry is set again according to the method of replacement of the apparatus to be tested (step S507). The command corresponding to the content in the access address registration region is added to the random command row memory region (step S508).

Afterwards, as shown in FIG. 16, one value is randomly selected from 0 to 2 (step S508), and when the selected value is 0 (step S509; Yes), the command code of the command (first command) added to the random command row memory region at step S503 is changed to a store system command code, and the command code of the command (second command) added to the random command row memory region at step S508 is changed to a load system command code (step S510).

When the selected value is 1 (step S511; Yes), the command code of the first command is changed to a load system command code, and the command code of the second command to a store system command code (step S512). When the selected value is 2 (step S511; No), the command code of the first command is changed to a store system command code, and the command code of the second command to a store system command code (step S513).

Figure 17:
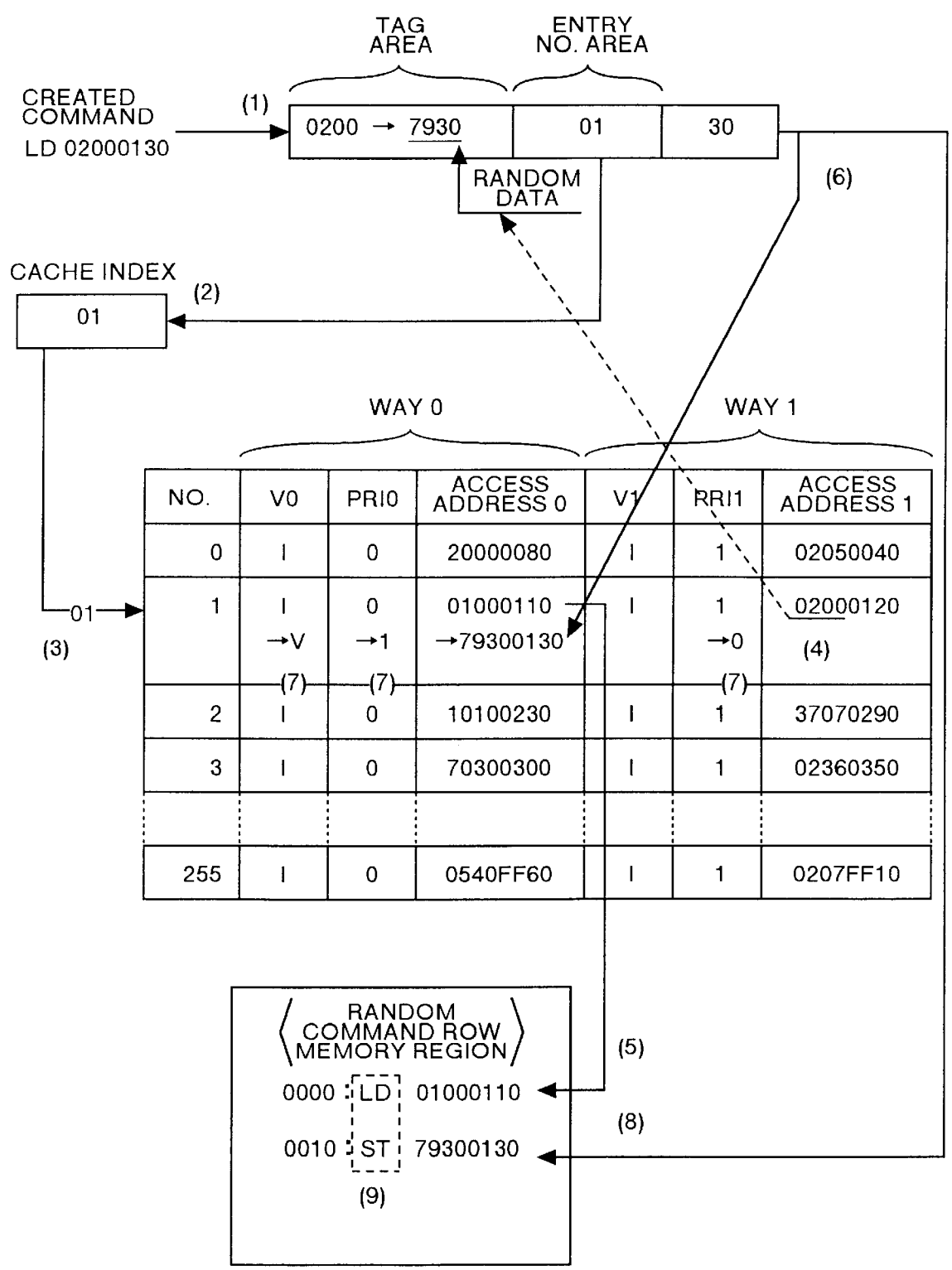
FIG. 17 is an explanatory diagram showing the command row creating process for entry competition test executed by the cache testing apparatus of the invention.
Figure 18:
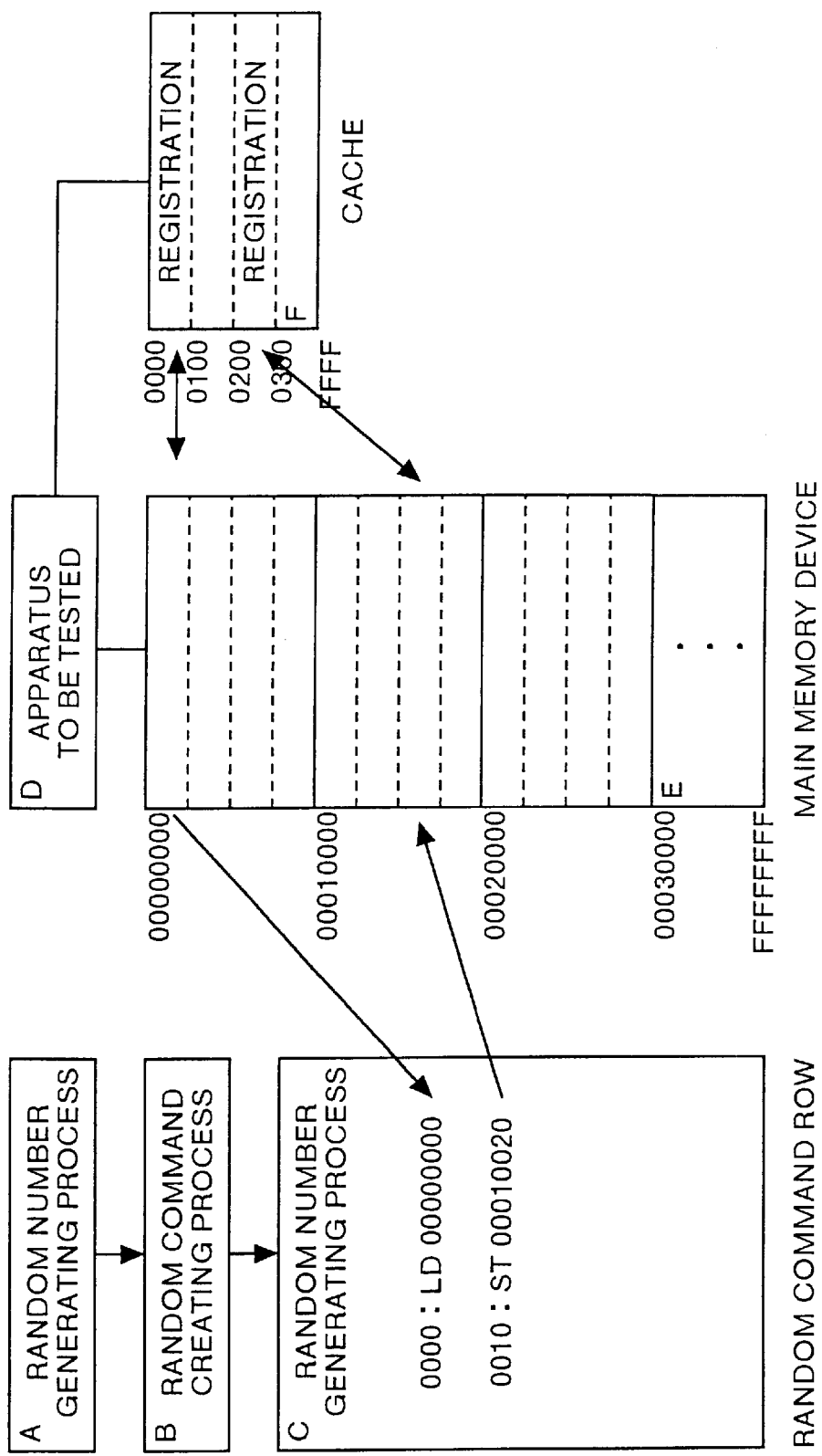
FIG. 18 is an explanatory diagram showing a cache testing method by a conventional random command test.

Relating to an example of test of the cache of the same specification as used in explanation of command row creating process for initializing the cache, the command row creating process for entry competition test is more specifically described below by referring to FIG. 17.

In the command row creating process for entry competition test, after completion of initialization of all V flags in the cache registration table, if the first created memory access command is "LD 02000130", as shown schematically in the diagram, the memory access address "02000130" is stored in the access address registration region (1), and the content "01" of the entry number area is stored in the cache index memory region (2).

In the access address about two ways of the entry indicated by this cache index (that is, the entry of entry number 1), it is judged if there is tag area content of "0200" or not (3). In the shown case, since the tag area content of the access address 1 coincides with the tag area content in the access address registration region, the tag area content in the access address registration region is replaced by random data (7930) (4).

In the access address relating to the entry of entry number 1, after it is known that there is no access address of tag area content of 7930 (not shown), in this case, the access address "01000110" of the way in the lowest position of the priority rank of the entry of entry number 1 is added to the random command row memory region (5). Then the access address 0 of the entry of entry number 1 is replaced by the content in the access address registration region (5). Further, the V flag V0 relating to the entry of entry number 1 is replaced by "V", and PRI0 and PRI1 of the entry of entry number 1 are set again (7).

In the random command row memory region, the command "LD 079300130" having the content in the access address registration region as memory access address is stored (8). Further, concerning the two commands added to the random command row memory region, the command codes are replaced so that any one of three interference states (read-after-writer interference, write-after-write interference, write-after-right interference) may occur (9).

As explained herein, according to the cache testing apparatus and cache testing method of the invention, the cache can be verified promptly and securely.

More specifically, the individual blocks in the cache can be verified (initialized) without duplication. In the event of cache hit, the cache can be verified without duplication. Further, in the event of cache hit in the cache having a plurality of ways, if the priority rank is changed, the operation can be verified in each block without duplication. The operation in the event of cache error, the individual blocks of the cache can be verified without duplication.

INDUSTRIAL APPLICABILITY

The cache testing apparatus and cache testing method of the invention are, as explained herein, useful for verifying that the designed or manufactured cache operates normally, in the information processing apparatus designed to enhance the operating speed (increase the main memory access speed) by using the high speed buffer memory called the cache, and are suited sufficiently to verification of the cache large in the number of entries (number of sets) and number of ways provided in the recent information processing apparatuses.

What is claimed is:

1. A testing apparatus for testing a cache, which apparatus uses a test command row composed of memory access commands that utilize said cache to test said cache, said testing apparatus comprising:

a cache registration table composed of a plurality of blocks corresponding to each one of a plurality of cache entries, with each block assigned with an address registration region for storing an access address of data stored in a corresponding entry, and a flag region for storing information showing validity of test command corresponding to the entry;

a command creating unit which creates the memory access commands including information of cache entry;

a first registering unit which registers the access address of the memory access command in the address registration region when the information in the flag region of the block corresponding to the entry indicated by the memory access command created by said command creating unit shows an invalid state, and changing the information in the flag region to the information showing validity; and a second registering unit which selects a block having a flag region showing an invalid state when the information in the flag region of the block corresponding to the entry indicated by the memory access command shows a valid state, changing the cache entry included in this address to a cache entry corresponding to the selected block, registering the access address information of the memory access command in the address registration region of the selected block, and changing the information in the flag region of the selected block to information showing validity.

2. The testing apparatus according claim 1 further comprising:

an invalidating unit which changes the information in the flag region of each block of the cache registration table to information showing invalidity;

a first re-registering unit which changes the access address of the memory access command to the access address in the address registration region of the block when the flag region of the block corresponding to the cache entry indicated by the memory access command created by said command creating unit shows an invalid region, and also changing the information in the flag region to information showing validity; and a second re-registering unit which selects the block having a flag region showing an invalid state when the flag region showing invalid state is not present in the block corresponding to the cache entry indicated by the memory access command created by said command creating unit, changing the access address of the memory access command to an access address in the address registration region of the selected block, and changing the information in the flag region of the selected block to information showing validity.

3. The testing apparatus according to claim 2, wherein each entry of said cache is composed of a plurality of ways, and each block in said cache registration table is assigned, in each way, with address registration region, flag region, and rank information region showing priority rank of ways, and said invalidating unit changes the information in the flag region of the way other than the way of the highest priority rank of each block to information showing invalidity.

4. The testing apparatus according to claim 2, further comprising:

a comparing unit which compares the information about the access address of the memory access command created by said command creating unit and the address information in the address registration region of a specified block; and an address reproducing unit which creates address information different from the address registration region when there is the address registration region for storing the address information coinciding with the address information of the memory access command in the block, wherein said first and second registering units are the means for changing the address information of the block and memory access command to the address information created by said command reproducing unit.

5. A testing method for testing a cache, which method uses a test command row composed of memory access commands that utilize said cache to test said cache, the testing method comprising:

a step of creating a memory access command including information of cache entry;

a step of judging whether the test command using the cache entry indicated by the memory access command is registered or not;

a step of registering the memory access command as the test command using the cache entry when test command for the entry is not registered; and a step of selecting other cache entry in which test command is not registered when test command using the entry is registered, changing the cache entry indicated by the memory access command to the selected cache entry, and registering the memory access command as the test command using the selected cache entry.

6. The testing method according to claim 5, further comprising:

a step of invalidating the registered test command;

a step of judging whether the test command to the cache entry indicated by the memory access command created at the step of creating the memory access command is invalid or not; and a step of selecting a cache entry in invalid state of test command when the test command to the cache entry is valid, changing the access address of the memory access command to the access address indicated by the test command to the selected cache entry, and re-registering the memory access command as a test command to the selected cache entry.

7. The testing method according to claim 5, wherein said entry is composed of a plurality of ways, and the testing method further comprising:

a step of invalidating the test command registered in each way;

a step of changing the access address of the memory access command to the access address indicated by the test command corresponding to the way when there is a test command invalidated way in the cache entry indicated by the memory access command created at the step of creating the memory access command, and re-registering the memory access command as a test command to the way; and a step of selecting the cache entry including the test command invalidated way when there is no way invalidated in test command in the cache entry indicated by the memory access command, changing the access address of the memory access command to the access address of the test command corresponding to the way of the selected cache entry, and re-registering the memory access as the test command corresponding to the way.

8. The testing method according to claim 5, further comprising:

a step of invalidating the registered test command;

a step of comparing the access address information indicated by the memory access created at the command creating step with the access address indicated by the test command corresponding to a specified cache entry;

an address creating step of creating address information different from the address information when the address information contents coincide with each other;

a step of changing the access address of the memory access command by using the address information created at the address creating step when the test command to the cache entry indicated by the memory access command is invalid, and re-registering the memory access command as the test command to the cache entry; and a step of selecting the cache entry in test command invalid state when the test command to the cache entry is valid, changing the access address of the memory access command by using the address information created at the address creating step, and re-registering the memory access command as a test command to the selected cache entry.

* * * * *